US 011990872B2

(12) United States Patent
Tucker et al.

(10) Patent No.: US 11,990,872 B2
(45) Date of Patent: May 21, 2024

(54) POWER AMPLIFIER MODULES INCLUDING TOPSIDE COOLING INTERFACES AND METHODS FOR THE FABRICATION THEREOF

(71) Applicant: NXP USA, Inc., Austin, TX (US)

(72) Inventors: Geoffrey Tucker, Tempe, AZ (US); Lakshminarayan Viswanathan, Phoenix, AZ (US); Jeffrey Kevin Jones, Chandler, AZ (US); Elie A. Maalouf, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 325 days.

(21) Appl. No.: 16/851,895

(22) Filed: Apr. 17, 2020

(65) Prior Publication Data

US 2021/0328552 A1    Oct. 21, 2021

(51) Int. Cl.
*H01L 23/367* (2006.01)
*H01L 21/56* (2006.01)
(Continued)

(52) U.S. Cl.
CPC ........... *H03F 1/301* (2013.01); *H01L 21/561* (2013.01); *H01L 21/565* (2013.01);
(Continued)

(58) Field of Classification Search
CPC . H03F 3/189; H03F 3/19; H03F 3/193; H03F 3/1935; H03F 3/20–2178;
(Continued)

(56) References Cited

U.S. PATENT DOCUMENTS

| | | | |
|---|---|---|---|
| 5,880,524 A | 3/1999 | Xie | |
| 6,366,486 B1 * | 4/2002 | Chen | H05K 1/165 |
| | | | 363/141 |

(Continued)

FOREIGN PATENT DOCUMENTS

GB    2574160 A8    11/2019

OTHER PUBLICATIONS

Soga, et al; "Thermal Management for Flip-Chip High Power Amplifiers Utilizing Carbon Nanotube Bumps"; IEEE International Symposium on Radio-Frequency Integration Technology; 4 pages (Jan. 2009).

(Continued)

*Primary Examiner* — Bradley Smith
*Assistant Examiner* — William Henry Anderson

(57) ABSTRACT

Power amplifier modules (PAMs) having topside cooling interfaces are disclosed, as are methods for fabricating such PAMs. In embodiments, the method includes attaching the RF power die to a die support-surface of a module substrate. The RF power die is attached to the module substrate in an inverted orientation such that a frontside of the RF power die faces the module substrate. When attaching the RF power die to the module substrate, a frontside input/output interface of the RF power die is electrically coupled to corresponding substrate interconnect features of the module substrate. The method further includes providing a primary heat extraction path extending from the transistor channel of the RF power die to a topside cooling interface of the PAM in a direction opposite the module substrate.

13 Claims, 12 Drawing Sheets

(51) Int. Cl.
*H01L 23/00* (2006.01)
*H01L 23/31* (2006.01)
*H01L 23/528* (2006.01)
*H03F 1/30* (2006.01)
*H03F 3/21* (2006.01)

(52) U.S. Cl.
CPC ...... *H01L 23/3121* (2013.01); *H01L 23/3675* (2013.01); *H01L 23/528* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 24/97* (2013.01); *H03F 3/21* (2013.01); *H01L 2224/16227* (2013.01); *H01L 2224/32245* (2013.01); *H01L 2224/73253* (2013.01); *H01L 2224/92225* (2013.01); *H03F 2200/451* (2013.01)

(58) Field of Classification Search
CPC ............ H03F 2200/451; H05K 1/0201; H05K 1/0203; H05K 1/0204; H05K 1/0206; H05K 1/0207
See application file for complete search history.

(56) References Cited

U.S. PATENT DOCUMENTS

| | | | |
|---|---|---|---|
| 7,053,482 B2 | 5/2006 | Cho | |
| 7,132,744 B2 | 11/2006 | Zhao et al. | |
| 7,259,448 B2 | 8/2007 | Zhang et al. | |
| 7,259,457 B2 | 8/2007 | Zhang et al. | |
| 7,799,614 B2 | 9/2010 | Otremba et al. | |
| 7,892,882 B2* | 2/2011 | Leal | H01L 24/32 |
| | | | 438/106 |
| 8,507,320 B2 | 8/2013 | Otremba et al. | |
| 8,513,062 B2 | 8/2013 | Nikitin et al. | |
| 9,190,970 B2 | 11/2015 | Cuoco et al. | |
| 9,269,648 B2 | 2/2016 | Higgins, III | |
| 9,468,087 B1* | 10/2016 | Joshi | H05K 1/0204 |
| 9,509,251 B2 | 11/2016 | Jones | |
| 9,673,162 B2* | 6/2017 | Viswanathan | H01L 24/82 |
| 9,899,292 B2 | 2/2018 | Chiu et al. | |
| 9,986,646 B2 | 5/2018 | Viswanathan et al. | |
| 10,440,813 B1 | 10/2019 | Li et al. | |
| 11,114,363 B2* | 9/2021 | Nair | H01L 23/552 |
| 11,557,545 B2 | 1/2023 | Ketterson | |
| 2007/0045822 A1 | 3/2007 | Diaz et al. | |
| 2010/0029045 A1 | 2/2010 | Ramanathan et al. | |
| 2010/0109052 A1* | 5/2010 | Nakajima | H01L 21/823475 |
| | | | 257/E27.06 |
| 2011/0095403 A1 | 4/2011 | Lee et al. | |
| 2011/0127675 A1 | 6/2011 | Ewe et al. | |
| 2014/0110788 A1 | 4/2014 | Cho et al. | |
| 2015/0255380 A1 | 9/2015 | Chen | |
| 2016/0126905 A1 | 5/2016 | Zhao et al. | |
| 2017/0117204 A1 | 4/2017 | McPartlin et al. | |
| 2017/0117853 A1 | 4/2017 | McPartlin et al. | |
| 2017/0117857 A1 | 4/2017 | McPartlin et al. | |
| 2017/0317002 A1* | 11/2017 | Kitahara | H01L 25/18 |
| 2018/0034421 A1* | 2/2018 | Abdo | H01L 23/5223 |
| 2018/0090475 A1 | 3/2018 | Zuo et al. | |
| 2019/0057924 A1 | 2/2019 | Kim et al. | |
| 2019/0173195 A1 | 6/2019 | Kim et al. | |
| 2019/0305205 A1* | 10/2019 | Feichtinger | H05K 1/183 |
| 2020/0309582 A1* | 10/2020 | Halimi | G01F 1/684 |

OTHER PUBLICATIONS

Yuen, Cindy et al; "A Compact Flip Chip High Power Amplifier Module for Mobile Applications"; Proceedings of Asia Pacific Microwave Conference; 4 pages (Dec. 7, 2010).
U.S. Appl. No. 16/852,064 NFOA Oct. 13, 2023; 12 pages.

* cited by examiner

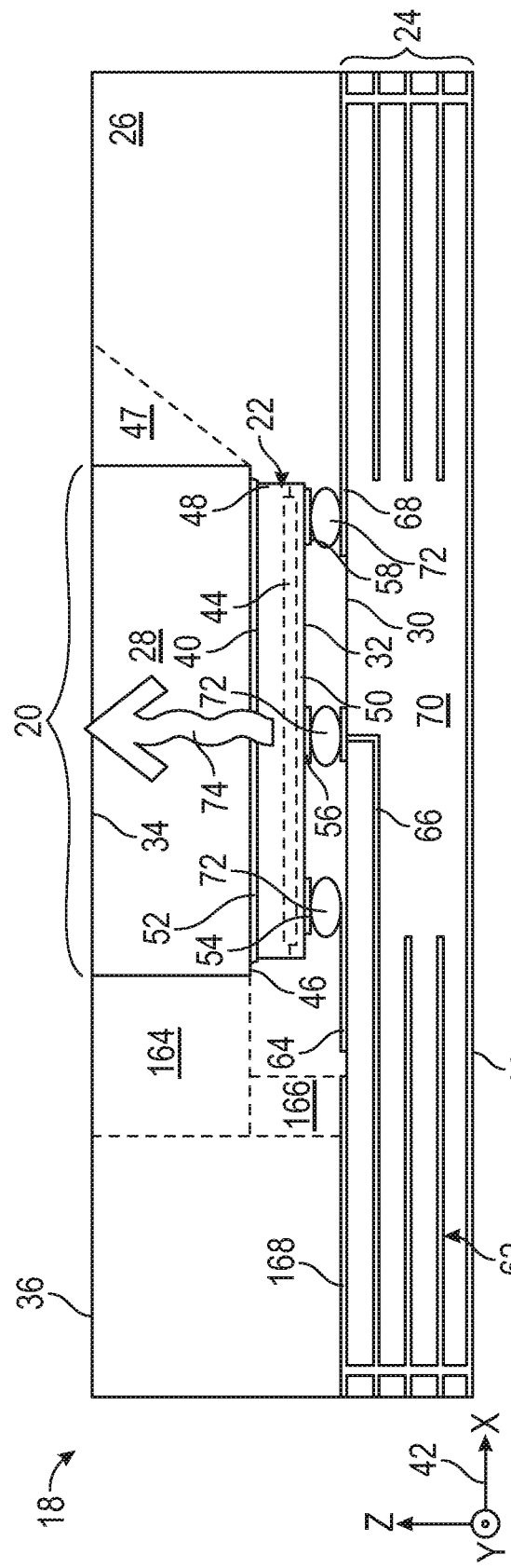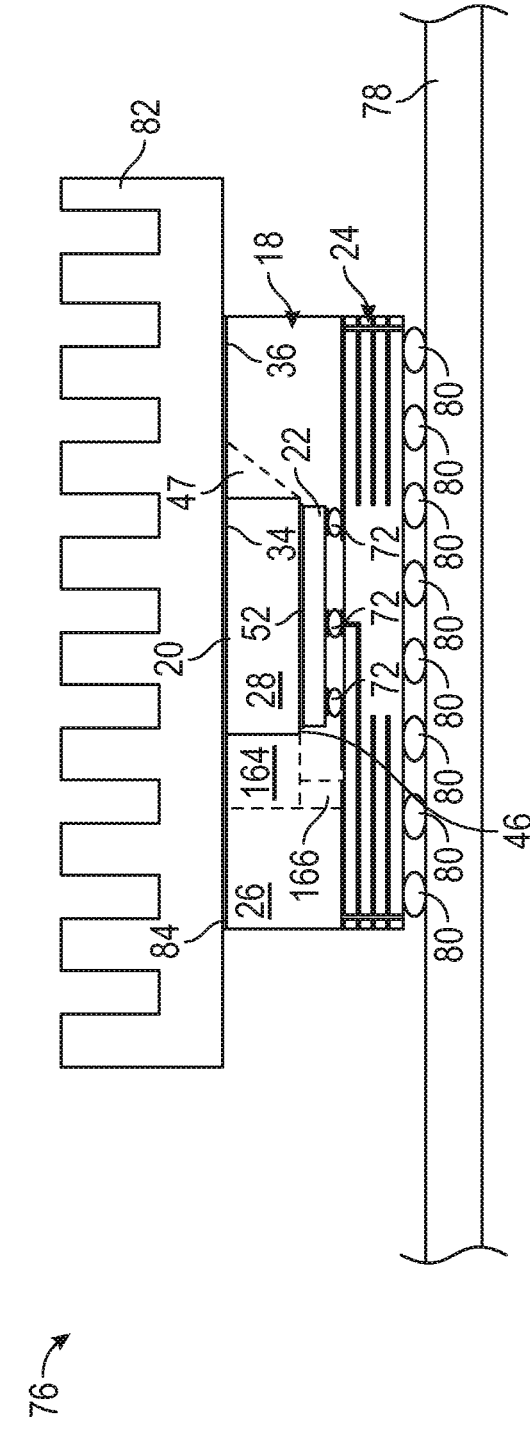

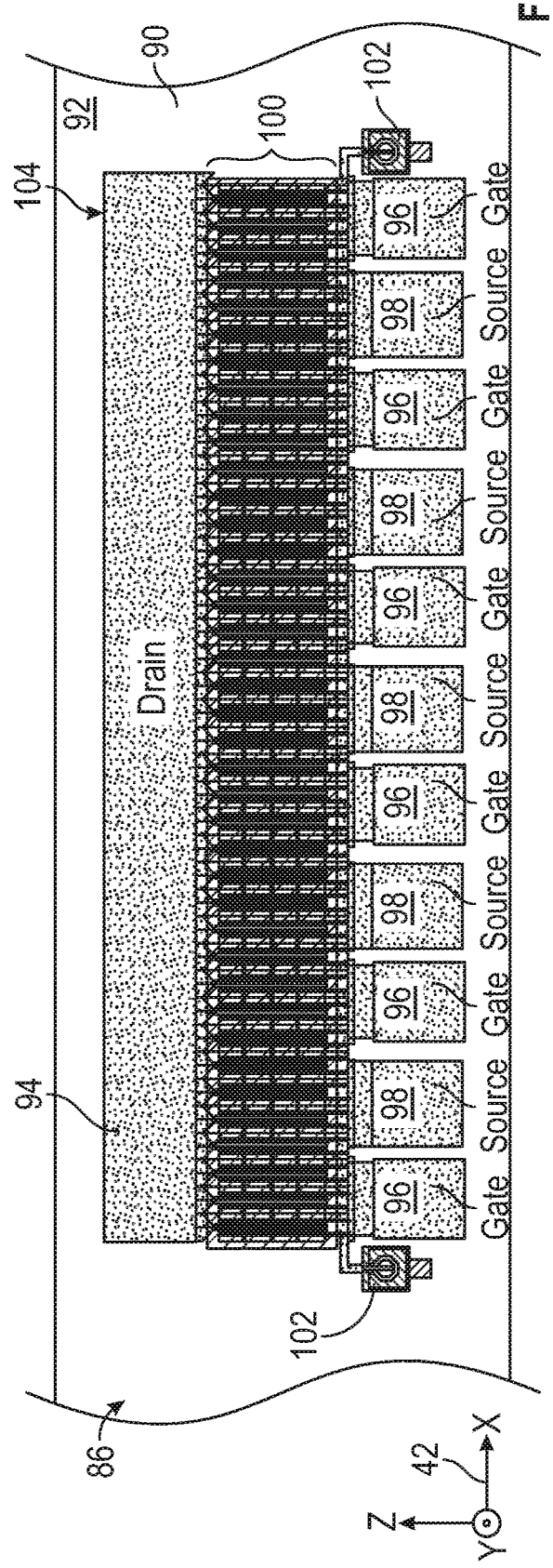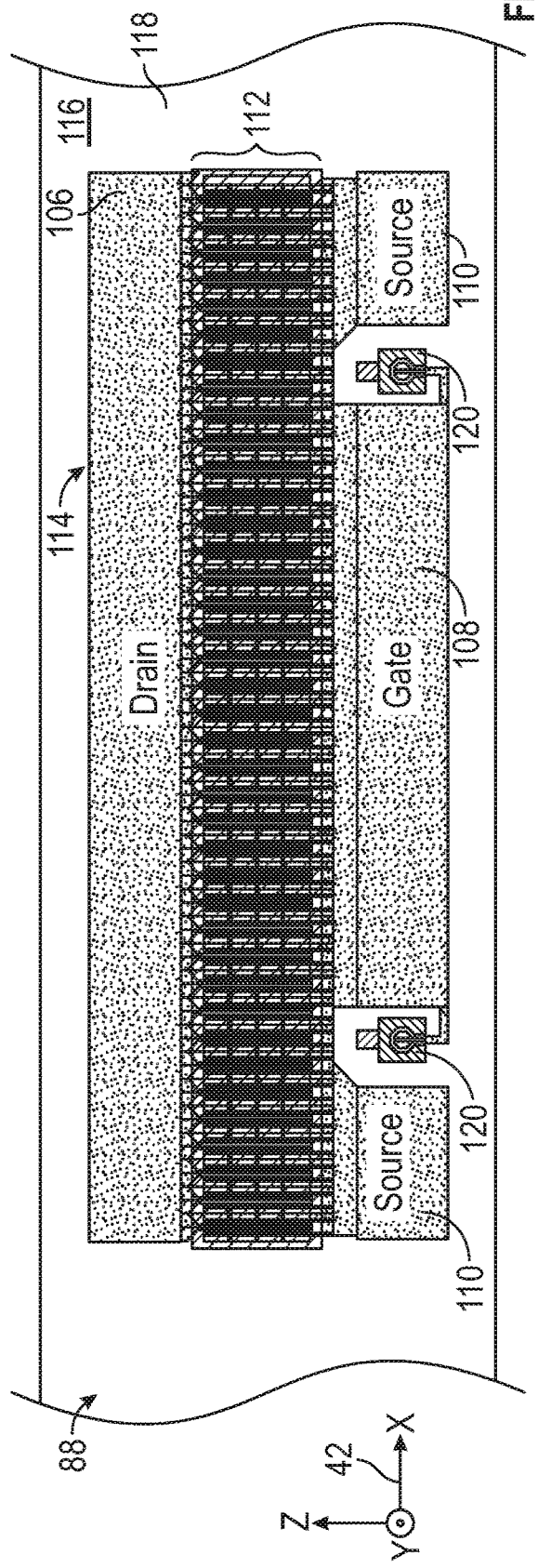

POWER AMPLIFIER MODULES INCLUDING TOPSIDE COOLING INTERFACES AND METHODS FOR THE FABRICATION THEREOF

TECHNICAL FIELD

Embodiments of the present disclosure relate generally to microelectronics and, more particularly, to power amplifier modules and methods for fabricating power amplifier modules having topside cooling interfaces.

BACKGROUND

A power amplification module (PAM) typically includes a module substrate and at least one radio frequency (RF) power die, which is mounted to a module substrate in a non-inverted orientation. The module substrate may be, for example, a printed circuit board (PCB), a ceramic substrate, or another substrate having electrically-conductive routing features with which the RF power die is electrically interconnected. A given PAM may contain a single RF power die or multiple RF power dies in addition any number of other microelectronic components, such as discretely-placed capacitors and resistors. The RF power die or dies within a PAM may be prone to excess heat generation during operation, particularly when operated at higher radio frequencies (e.g., frequencies approaching or exceeding 3 Gigahertz) or fabricated utilizing a power dense die technology, such as a layered gallium nitride die structure. If not adequately dissipated, such excess heat can accumulate within the PAM and limit performance of the RF power die(s) contained therein. Traditionally, bottomside heat dissipation structures have been employed to dissipate such excess heat from regions adjacent the RF power die(s); e.g., by providing a thermal path extending from the backside of a given RF power die, through the module substrate, and to an assembly-level heatsink external to the PAM. Such bottomside heat dissipation structures are, however, typically limited in their heat dissipation capabilities and often are associated with various shortcomings, such as high fabrication costs and overly complex routing schemes.

BRIEF DESCRIPTION OF THE DRAWINGS

At least one example of the present invention will hereinafter be described in conjunction with the following figures, wherein like numerals denote like elements, and:

FIG. 1 is a simplified cross-sectional view of a power amplification module (PAM) including a topside cooling interface, a module substrate, and at least one radio frequency (RF) power die mounted to the module substrate in an inverted orientation, as illustrated in accordance with an example embodiment of the present disclosure;

FIG. 2 is a simplified cross-sectional view of a larger electronic assembly (partially shown) into which the example PAM shown in FIG. 1 may be incorporated, while the topside cooling interface is thermally coupled to an assembly-level heatsink external to the PAM;

FIGS. 3 and 4 are first and second planform schematics, respectively, of transistor layouts (here, field effect transistor structures) potentially integrated into an RF power die contained in the PAM shown in FIG. 1, as illustrated in accordance with example embodiments;

Figure 5:
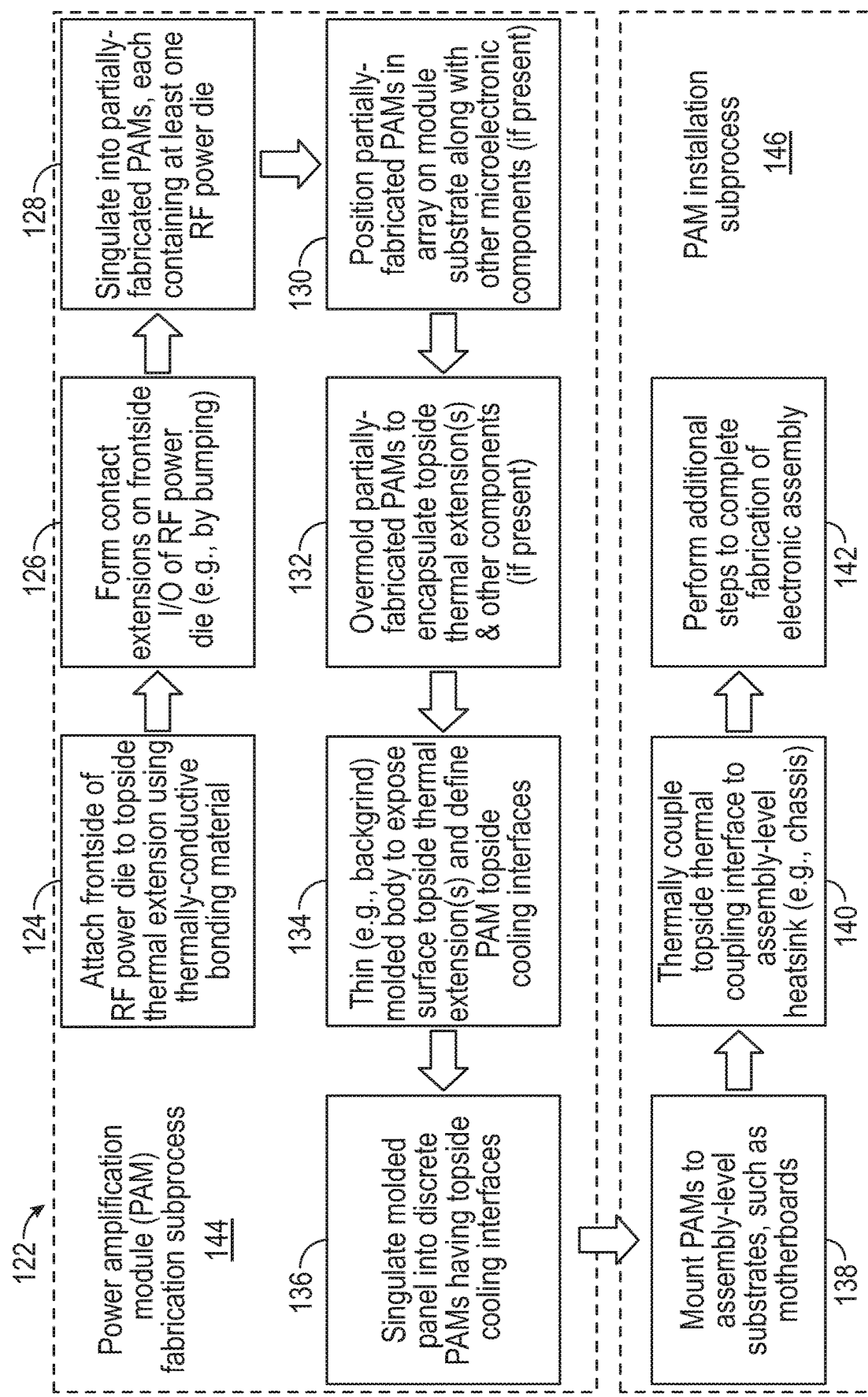
FIG. 5 is a flowchart of an overarching process including a first example subprocess for fabricating a number of PAMs similar or identical to the PAM shown in FIG. 1 and a second example subprocess for integrating one or more of the completed PAMs into an electronic assembly, such as that shown in FIG. 2.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

Definitions

The following definitions apply throughout this document. Those terms not expressly defined here or elsewhere in this document are assigned their ordinary meaning in the relevant technical field.

Backside—the side (outer principal surface) of a die opposite the frontside of the die (defined below), as taken along an axis orthogonal to the frontside of the die.

Bottomside—the side (outer principal surface) of a power amplification module or PAM (defined below) located closest to a module substrate contained in the PAM and to which one or more radio frequency (RF) power dies are mounted.

Frontside—the side (outer principal surface) of a die on which the bond pads are exclusively or predominately located.

Metallic—a material predominately composed of one or more metal constituents by weight percentage.

Power amplification module (PAM)—a modular electronic assembly containing at least one radio frequency (RF) power die utilized for power or signal amplification purposes.

Radio frequency (RF) power die—a semiconductor die bearing an integrated circuit (IC) containing at least one transistor utilized for RF power or signal amplification purposes.

Thermally Conductive—having a thermal conductivity exceeding 10 watts per meter-Kelvin (W/mk).

Topside—the side (outer principal surface) of a PAM (defined above) located opposite the bottomside of the PAM, as taken along an axis orthogonal to the topside of the PAM.

Overview

The following describes PAMs having enhanced heat dissipation capabilities due, at least in substantial part, to the provision of unique topside cooling interfaces. The term "topside cooling interface," as appearing herein, refers to an externally-accessible interface exposed along the topside of the PAM through which heat can be ready extracted from the body of the PAM and, specifically, from locations adjacent one or more RF power die (and possibly other heat-generating components) contained within the PAM. When the PAM is installed within a larger electronic assembly or system, the topside cooling interface may be left exposed (uncovered) to allow convective heat transfer to the ambient environment. More usefully, however, the topside cooling interface may be thermally coupled to an assembly-level heatsink when the PAM is installed within a larger electronic assembly to further promote excess heat outflow from the PAM and dissipation of the excess heat to the ambient environment Such an assembly-level heatsink can be, for example, a fin array, a metal chassis, or another thermally-conductive structure suitable for absorbing excess heat extracted from the PAM and convectively transferring excess heat to the surrounding environment. Electrical connections are further formed between the input/output (I/O) interface of the PAM and an assembly-level substrate, such as a motherboard, to which the PAM is mounted when the PAM is installed within a larger electronic assembly or system.

The PAM contains a module substrate to which one or more microelectronic components, including at least one RF power die, is mounted. The module substrate can be any supportive-structure to which at least one RF power die is suitably mounted and which includes electrically-conductive features (herein, "routing" or "interconnect" features) for interconnection with the I/O interface of the PAM. The I/O interface of the PAM is formed, at least in principal part, along the bottomside of the PAM at a location opposite the topside cooling interface, as taken along the centerline of the PAM. Further, the PAM contains at least one RF power die mounted to an upper surface or "die support surface" of the module substrate in an inverted orientation; that is, such that the frontside of the RF power die faces the die support surface of the module substrate. A primary heat extraction path extends from the backside of the inverted RF power die to the topside thermal interface of the PAM. The primary heat extraction path extends away from (and thus bypasses) the module substrate) and further avoids extending through any regions of the PAM composed of materials having lower thermal conductivity. In so doing, the primary heat extraction path provides a direct, highly efficient pathway for withdrawing excess heat generated by the inverted RF power die through the backside of the RF power die and ultimately through the topside cooling interface of the PAM. Further, in embodiments, the topside cooling interface may be sized to have planform dimensions (e.g., a length and width) substantially equivalent to, if not exceeding the planform dimensions (e.g., the length and width) of the inverted RF power die to provide a relatively large volume heat extraction conduit and to maximize the surface area of the topside cooling interface, further enhancing the heat dissipation capabilities of the host PAM.

In certain embodiments, the PAM contains at least one topside thermal extension; that is, a thermally-conductive structure bonded to the backside of an inverted RF power die and extending from the RF power die toward the topside cooling interface. The topside thermal extension may be deposited directly on the backside of the RF power die by, for example, plating a relatively thick metallic (e.g., Cu) layer onto the die backside during manufacture of the PAM. Alternatively, the topside thermal extension may be provided as a prefabricated piece or part, which is bonded to the backside of the RF power die utilizing a thermally-conductive bonding material. In this latter case, the topside thermal extension can be formed from various metallic and non-metallic materials having relatively high thermal conductivities; e.g., in embodiments, the topside thermal extension may be composed of a material having a thermal conductivity exceeding 100 W/mk and, perhaps, exceeding 200 W/mk. When present, the topside thermal extension may extend from a location adjacent the backside of the RF power die to a location adjacent or co-terminal with the topside thermal interface of the PAM. In this latter regard, the upper surface of the topside thermal extension (that is, the surface opposite the RF power die) may be exposed from the topside of the PAM to define or help define the topside cooling interface in at least some embodiments. As a more specific example, in embodiments in which the PAM further includes a molded module body encapsulating the inverted RF power die, the upper end of the topside thermal extension may terminate at a location substantially coplanar with an outer principal surface of the molded module body to define the topside thermal interface.

When provided, the topside thermal extension may or may not be electrically-active; that is, utilized for electrical power or signal transmission purposes. In embodiments in which the topside thermal extension is not electrically active, the inverted RF power die may be designed such that the I/O interface of the RF power die is entirely provided on the frontside of the die. Accordingly, in such embodiments, all I/O terminals to the transistor IC carried by the RF power die may be contained in a frontside I/O for direct connection to the module substrate. In implementations in which at least one field effect transistor (FET) is integrated into the RF power die, the source, drain, and ground contacts of the FET may be electrically coupled to corresponding terminals provided in a frontside I/O of the inverted RF power die. Unique FET designs or layouts, which facilitate such a frontside-exclusive interconnection scheme, are discussed below in connection with FIGS. 3 and 4. In other implementations, the topside thermal extension may be electrically active and utilized for signal or power routing purposes. Again considering an example implementation in which at least one FET is integrated into a given RF power die contained in a PAM, the source contacts of the FET may be electrically coupled to the topside thermal extension through the backside of the RF power die. The topside thermal extension may, in turn, be electrically coupled to a corresponding interconnect feature (e.g., a trace terminating in a bond pad) on the module substrate; e.g., by forming an electrically-conductive pathway extending from an outer peripheral portion of the topside thermal extension to the die support surface of the module substrate. In various embodiments, this may be accomplished by dimensioning the topside thermal extension to extend beyond the underlying RF power die in at least one planform dimension to create an peripheral overhang portion. To complete the desired electrical path, the peripheral overhang portion may be electrically coupled to the corresponding interconnect feature of the module substrate by wirebonding, by providing one or more vertically-extending contacts (e.g., one or more solder balls or discretely-placed metal blocks) at the juncture between the interconnect feature and the peripheral overhang portion, or by further imparting the topside thermal extension with one or more outer peripheral walls extending downwardly (thus flanking one or more surfaces of the die) toward the module substrate for electrical interconnection therewith.

Embodiments of the PAMs described herein provide other benefits in addition to enhancements in thermal performance. For example, in certain implementations, the below-described PAMs have unique architectures physically separating the electrical ground return path and the primary heat extraction path of the PAM. As a more specific example, and as briefly mentioned above, embodiments of the PAM contain an RF power die having an I/O interface formed entirely on the frontside of the die. The frontside I/O interface of the RF power die is interconnected with electrically-conductive interconnect features of the module substrate when the RF power die is mounted to the module substrate in an inverted orientation, as previously described. In such embodiments, the provision of an electrical ground connection through the backside of the die may be rendered unnecessary, potentially reducing cost by enabling the elimination or reduction of conductive vias (e.g., through substrate vias (TSVs)) formed through the RF power die. Additionally, such a frontside I/O interconnection scheme between the RF power die and the module substrate allows the usage of surface mount technology (e.g., solder bumps or balls) in interconnecting the RF power die, thereby avoiding or reducing reliance upon the formation of bond wires that may otherwise complicate and potentially detract from the electrical performance of the PAM at higher operational frequencies. Moreover, additional costs savings may also be achieved through the elimination of wire bonds and associated materials, such as gold-containing (Au-containing) bond pads. Such benefits notwithstanding, additional electrical interconnection (e.g., grounding) may be provided through the die backside in other embodiments, as further discussed in connection with FIGS. 12 and 13 below.

Efficient, cost-effective manufacturing processes for fabricating the PAMs described herein are also provided. In one such manufacturing process, a partially-fabricated PAM is first fabricated during initial fabrication stages by, for example, bonding the backside of at least one RF power die to a topside thermal extension, such as metallic (e.g., copper) slug or other electrically-conductive piece. For increased process efficiency, the partially-fabricated PAM may be concurrently produced with a plurality of other PAMs by bonding each PAM to a corresponding topside thermal extension, while the topside thermal extensions remain interconnected in panel form. The thermal extension panel may be subsequently singulated to yield a plurality of singulated units, which are mounted (physically attached and electrically interconnected) to module substrates. The module substrates may be PCBs, coreless substrates, ceramic substrates, or other routed substrates, which are likewise interconnected in panel form. Overmolding is then be performed to create a molded panel having an excessive thickness or overburden fully covering the upper surfaces of the topside thermal extensions of the partially-completed PAMs. Afterwards, the molded panel may be thinned (e.g., by back-grinding) to expose the respective topsides of the thermal extensions and thereby define the topside cooling interfaces of the PAMs. Afterwards, a second singulation process may be performed to separate the panel assembly (that is, the molded panel and the module substrate panel) into a plurality of completed PAMs having topside cooling interfaces. An example of one such manufacturing process is further described below in connection with FIGS. 5-11. Other manufacturing processes for fabricating PAMs having topside cooling interfaces are also possible and envisioned, as will become apparent from the following description taken in conjunction with the accompanying drawing figures.

Example embodiments of PAMs having topside cooling interfaces will now be described in conjunction with FIGS. 1-4, 12, and 13, while example methods for fabricating such PAMs utilizing panel-level manufacturing process flow are further discussed below in connection with FIGS. 5-11. For ease of explanation, the following initially describes PAMs having relatively simple constructions; e.g., the example PAMs discussed below in conjunction with FIGS. 1-11, 12, and 13 may each contain a single RF power die (or two dies) enclosed in a molded module body. However, as further discussed below in connection with FIG. 14, embodiments of the PAMs can vary in complexity and may contain any practical number of RF power dies and other microelectronic components distributed across a module substrate including, for example, any number of surface mount devices (SMDs), embedded routing structures, or other IC-bearing semiconductor die. Further, alternative embodiments may not include a molded die-encapsulating body or may otherwise differ relative to the below-described PAMs, providing that each PAM includes at least one topside cooling interface facilitating extraction of excess heat generated by one or more RF power dies during usage of the PAM.

General Discussion of Power Amplifier Modules Including Topside Cooling Interfaces FIG. 1 is a simplified cross-sectional view of a PAM 18 having a topside cooling interface 20 and illustrated in accordance with an example embodiment of the present disclosure. In addition to topside cooling interface 20, PAM 18 contains at least one RF power die 22, a module substrate 24, a molded module body 26, and a topside thermal extension 28. RF power die 22 is mounted to an upper frontside or die support surface 30 of module substrate 24, such as a PCB, a ceramic substrate, a coreless substrate, or another routed structure suitable for supporting RF power die 22 and providing electrical interconnection therewith. RF power die 22 is mounted to module substrate 24 in an inverted orientation such that a frontside 32 of die 22 faces die support surface 30. Molded module body 26 encapsulates RF power die 22, contacts die support surface 30 of module substrate 24, and peripherally surrounds (that is, extends around) topside thermal extension 28. An upper principal surface 34 of topside thermal extension 28 is substantially coplanar or flush with an outer principal surface 36 of molded module body 26. Jointly, upper principal surface 34 of topside thermal extension 28 and an upper principal surface 36 of molded module body 26 define an outer principal surface of topside 34, 36 of PAM 18. In other embodiments, and depending upon the manner in which PAM 18 is fabricated, topside thermal extension 28 may be recessed relative to or project above topside 34, 36, providing that upper principal surface 34 of topside thermal extension 28 is externally exposed along PAM topside 34, 36 to provide the option of subsequent thermal coupling to an assembly-level heatsink when PAM 18 is installed within a larger electronic system or assembly, as further described below in connection with FIG. 2.

RF power die 22 includes a backside 40 opposite frontside 32, as taken along a centerline or vertical axis of PAM 18 (parallel to the Z-axis of coordinate legend 42 in FIG. 1). At least one RF power transistor (here, a FET 44) is formed in and over a die body 48; the term "over" utilized in a relative sense to denote a vertically-overlapping relationship taken along a vertical axis extending orthogonal to frontside 32 and backside 40 of RF power die 22. Die body 48 is at least partially composed of a body or layer semiconductor material in which the channel of FET 44 is formed. In certain embodiments, die body 48 may be entirely composed of such a semiconductor material when, for example, RF power die 22 is produced utilizing a singulated piece of a bulk silicon (Si) wafer. In other instances, die body 48 may have a more complex, layered structure. This may be the case when, for example, RF power die 22 is produced utilizing a layered die technology enabling relatively high transistor power densities, which tend to generate relatively high concentrations of excess heat and are thus well-suited for integration into the high thermal performance PAMs described herein. An example of such a power dense die technology is a layered GaN structure in which one or more layers of a GaN material (that is, a semiconductor material containing GaN as its primary constituent by weight) are formed over one or more substrate layers of another material, such as silicon carbide (SiC). The term "die," as appearing herein, thus encompasses both the semiconductor material-containing body of the die, as well as the layers formed on the die body during wafer level processing.

Regardless of the particular die technology employed, the transistor channel is formed along or slightly beneath a principal surface of a semiconductor material body or layer within RF power die 22. During transistor fabrication, selected regions of the semiconductor material body are doped to define the source and drain regions of FET 44. A number of frontside layers 50 are then built-up or successively compiled over this surface to define the contact portions of the transistor; e.g., in the case of FET 44, the gate contact fingers, the gate manifold, the drain lines, and the drain manifold. Specifically, a first patterned metal layer (commonly referred to as the "M1" layer) may be formed over the semiconductor material body to define such features, as further described below in conjunction with FIGS. 3 and 4. Additional patterned metal layers may then be formed, along with intervening dielectric layers, to create the desired interconnect line or integrated wiring structure of RF power die 22. The last metal layer is also typically pattered to create a number of bond pads 54, 56, 58, as shown in FIG. 1. Frontside layers 50 may terminate in an outer passivation layer in embodiments, which may define or help define frontside 32 of RF power die 22. Collectively, bond pads 54, 56, 58 serve as a frontside I/O interface of RF power die 22. Backside 40 of RF power die 22 may further server as an I/O terminal (e.g., a ground or source terminal) in embodiments, while backside 40 may be electrically-inactive in other implementations of PAM 18 such that the I/O of RF power die 22 is formed exclusively on frontside 32.

A frontside I/O interface, including at least first, second, and third bond pads 54, 56, 58, respectively, is thus formed on frontside 50 of RF power die 22. In the illustrated embodiment in which FET 44 is formed in RF power die 22, and by way of non-limiting example, a first pad 54 (or a first set of bond pads) may serve as an input terminal of RF power die 22 electrically coupled to the gate terminal of FET 44; a second bond pad 56 (or a second set of bond pads) may serve as an output terminal of die 22 electrically coupled to the drain terminal of FET 44; and a third bond pad 58 (or a third set of bond pads) may serve as a ground (or other reference voltage) terminal of die 22 electrically coupled to the source terminal of FET 44. In one approach, increased isolation between the gate and drain signals is achieved by positioning the ground terminal (bond pad 56) between the source terminal (one of bond pads 54, 58) and the drain terminal (the other of bond pads 54, 58). A corresponding I/O interface is provided on a die support surface 30 of module substrate 24, with various electrically-conductive interconnect features 62 (vias and substrate interconnect lines) formed in or on module substrate 24 to electrically couple the interconnection interface formed on die support surface 30 with the assembly-level interface formed on the outer principal surface of module substrate 24 (corresponding to PAM bottomside 38 in the illustrated example). Accordingly, electrically-conductive interconnect features 62 may include first, second, and third interconnects lines 64, 66, 68 formed in a body of dielectric material 70 (e.g., a ceramic or laminated layers of a PCB) electrically coupled to die bond pads 54, 56, 58, respectively, during fabrication of PAM 18. Depending upon the manner in which PAM 18 is fabricated, die bond pads 54, 56, 58 may be electrically coupled to the bond pads and interconnect lines 64, 66, 68 of module substrate 24 through a number of lower contact extensions 72, such as a number of solder balls or bumps. However, other interconnection structure or schemes for providing the desired electrical connections between the frontside I/O interface of RF power die 22 and module substrate 24 may be employed in alternative implementations. For example, in other implementations, RF power die 22 may be directly mounted to module substrate 24 without the provision of contact extensions, subject to the manufacturing process utilized to produce PAM 18.

With continued reference to FIG. 1, backside 40 of RF power die 22 is bonded to an interior or lower principal surface 46 of topside thermal extension 28 by a thermally-conductive bond layer 52. Thermally-conductive bond layer 52 can be composed of any material suitable for mechanically joining RF power die 22 to topside thermal extension 28, while having a relatively high thermal conductivity; e.g., the thermal conductivity of bond layer 52 may exceed 30 W/mk and, perhaps, may exceed 100 W/mk in embodiments. Suitable materials include metal-filled (e.g., copper (Cu), gold (Au), and silver (Ag) filled) epoxies, solder materials (e.g., deposited solder pastes and solder finishes applied to topside thermal extension 28), and thermally-conductive die attach materials including metal-metal (e.g., tin-Cu) transition liquid phase systems. Additionally, in certain embodiments, thermally-conductive bond layer 52 may be composed of a sintered metallic material; that is, a material formed from sintered metallic particles and predominately composed of one or more metallic constituents, by weight. When formed from such a sintered material, thermally-conductive bond layer 52 may be predominately composed of Cu, Ag Au, or a mixture thereof, by weight. Also, in such instances, thermally-conductive bond layer 52 may or may not contain organic materials, such an epoxy added for strengthening purposes. If desired, the backside 40 of RF power die 22 may be metallized to form a robust metallurgical bond with thermally-conductive bond layer 52 when composed of a sintered metal material For example, in embodiments, a backmetal layer (e.g., a relatively thick layer of Cu) may be plated or otherwise deposited onto backside 40 of RF power die 22. Similarly, lower surface 46 of topside thermal extension 28 may likewise be plated, intentionally roughened, or otherwise treated to promote bonding with thermally-conductive bond layer 52 in embodiments.

Topside thermal extension 28 can be produced by depositing an electrically-conductive material onto backside 40 of RF power die 22, such as by plating one or more layers of a metal-containing material onto die backside 40. Alternatively, and as indicated in FIG. 1, topside thermal extension 28 may be provided as a prefabricated piece or part, which is positioned over and bonded to RF power die 22 via thermally-conductive bond layer 52. In embodiments, topside thermal extension 28 may assume the form of a metallic block predominately composed of a metallic material, such as Cu, Au, Ag, aluminum (Al), or nickel (Ni), and alloys thereof, by weight. In other embodiments, topside thermal extension 28 may be fabricated from a composite material or a non-metallic material having relatively high thermal conductivities. Such materials include, but are not limited to, diamond polycarbonate materials, diamond-metal composites (e.g., diamond Au, diamond Ag, and diamond Cu), Cu graphite, pyrolytic graphite, and materials containing allotropes of carbon, such as graphene and carbon nanotube-filled materials. Regardless of its particular composition, topside thermal extension 28 is ideally selected to have a relatively high thermal conductivity, particularly in a vertical direction (parallel to the Z-axis of coordinate legend 42) along which heat is conducted upwardly away from RF power die 22 and module substrate 24 during operation of PAM 18. Accordingly, in embodiments, topside thermal extension 28 may have a thermal conductivity exceeding 100 W/mk and, perhaps, a thermal conductivity exceeding 200 W/mk, as taken along the section of a primary heat extraction path extending through thermal extension 28 in a direction away from module substrate 24.

Topside thermal extension 28 may be imparted with a thickness greater than that of RF power die 22 in embodiments, as measured along a vertical or centerline axis (corresponding to the Z-axis of coordinate legend 42) and as indicated in FIG. 1 (not drawn to scale). In other embodiments, topside thermal extension 28 may have a thickness less than or substantially equivalent to RF power die 22. The planform dimensions (length and width) of topside thermal extension 28 may be substantially equal to or greater than the planform dimensions (length and width) of RF power die 22, as measured along the X- and Y-axes of coordinate legend 42, respectively. Two quantities are considered "substantially equivalent," as appearing in the context of this document, when the quantities differ by a disparity of less than 10%. Dimensioning topside thermal extension 28 in such a manner enlarges the area of lower surface 46 in contact with the backside 40 of RF power die 22 to promote heat flow from RF power die 22, through bond layer 52, and to topside thermal extension 28. In other embodiments, topside thermal extension 28 may be shaped such that the length and/or width of extension 28 increases (e.g., fans-out in a continuous or stepped manner) with increasing distance from RF power die 22 to further increase the surface area of topside thermal extension 28 relative to die backside 40. This possibility is illustrated in phantom line exclusively on the right side of FIGS. 1 and 2 by dashed region 47 one manner in which topside thermal extension 28 may be imparted with an inverted pyramidal geometry, which increases in width with increasing distance from RF power die 22 and increasing proximity to topside cooling interface 20. As further indicated in FIG. 1, topside thermal extension 28 may be generally centered over RF power die 22 in embodiments, as a taken along a vertical axis or centerline extending through PAM 18 (again, parallel to the Z-axis of coordinate legend 42) and intersecting thermal extension 28 and die 22. In other embodiments, topside thermal extension 28 may have a different positioning relative to RF power die 22, providing that topside thermal extension 28 is thermally coupled to backside 40 of RF power die 22. In many instances, topside thermal extension 28 will be positioned directly above RF power die 22; e.g., topside thermal extension 28 may be positioned to overlap at least a majority, if not the entirety of RF power die 22 as taken along a vertical or centerline axis extending through thermal extension 28 and die 22 and orthogonal to backside 40 of RF power die 22.

By virtue of the-above-described structural arrangement, a high thermal conductivity, dimensionally-robust heat extraction path is created extending from backside 40 of inverted RF power die 22, through thermally-conductive bond layer 52, through topside thermal extension 28, and to topside cooling interface 20 of PAM 18. Further, a straight line following the primary heat dissipation path can be drawn from backside 40 of RF power die 22 to topside cooling interface 20, with no portion of the straight line extending through a region of material having a thermal conductivity less than 30 W/mk or, perhaps, less than 100 W/mk in embodiments. Such a primary heat extraction path is represented in FIG. 1 by arrow 74 and provides an efficient, direct (non-tortuous), volumetrically robust thermal conduction path for transferring excess heat from RF power die 22 to an assembly-level heatsink external to PAM 18, when such an assembly-level heatsink present within the larger electronic assembly in which PAM 18 is ultimately installed. This may be further appreciated by referring to FIG. 2, which illustrates in simplified cross-section a portion of an electronic assembly 76 in which PAM 18 may be installed in an embodiment. As can be seen, electronic assembly 76 includes an assembly-level substrate 78, such as a motherboard, to which PAM 18 is mounted. The I/O interface of PAM 18 may be electrically coupled to corresponding interconnect features (e.g., bond pads and traces) on the upper surface of assembly-level substrate 78 utilizing any suitable interconnection technique, such as an array of solder balls 80. In other embodiments, a patterned solder layer, a land grid arrays (LGA), a pin grid array (PGA), or a different ball grid array (BGA) may be utilized to mount PAM 18 to and electrically interconnect PAM 18 with assembly-level substrate 78. Further, only a limited portion of assembly-level substrate 78 is shown in FIG. 2 for clarity. Various other components may be distributed across the non-illustrated portions of assembly-level substrate 78, potentially including other PAM's having topside cooling interfaces similar to topside cooling interface 20 of PAM 18, to form the desired circuit structure.

As shown in FIG. 2, assembly-level heatsink 82 may be mounted directly to topside 34, 36 of PAM 18 and bonded to topside cooling interface 20 utilizing, for example, a thermally-conductive bond layer 84 in embodiments. Thermally-conductive bond layer 84 can be composed of any thermally-conductive bonding material, including those discussed above in connection with thermally-conductive bond layer 52. In other embodiments, assembly-level heatsink 82 may be thermally coupled to topside cooling interface 20 in a less direct manner. For example, in other instances, assembly-level heatsink 82 may be spatially separated from PAM 18 and a thermal conduit, such as a metallic body or an elongated heat pipe, may be thermally coupled between heatsink 82 and topside cooling interface 20. Regardless of its particular location relative to PAM 18, assembly-level heatsink 82 can be any thermally-conductive structure or device suitable for absorbing excess heat extracted from PAM 18 through topside cooling interface 20. For example, in embodiments, assembly-level heatsink 82 may be a metal chassis, a fin structure (e.g., a pin-fin array), or another thermally-conductive body external to PAM 18. Assembly-level heatsink 82 will often, but need not necessarily have a volume exceeding that of topside thermal extension 28. Assembly-level heatsink 82 may be convectively cooled by releasing heat to the ambient environment; and, in certain embodiments, a fan may direct airflow against assembly-level heatsink 82 to promote convective heat transfer to the impinging airflow. It is also possible for assembly-level heatsink 82 to be actively cooled utilizing a liquid coolant in embodiments. Generally, then, assembly-level heatsink 82 can assume different forms and configurations depending upon the characteristics of electronic assembly 76. It is also possible for PAM 18 to be installed within a larger electronic system or assembly, while topside cooling interface 20 is left exposed (and thus not directly thermally coupled to a heatsink) if such an arrangement provides sufficient heat dissipation from PAM 18 in certain applications.

In addition to providing improved thermal performance through the provision of topside cooling interface 20, embodiments of PAM 18 may achieve other benefits by virtue of frontside I/O interface formed by bond pads 54, 56, 58 of RF power die 22, as described above. To support such a frontside I/O interface, the various terminals or contacts of the transistor IC carried by RF power die 22 are likewise formed to face frontside 32 of RF power die 22, which is defined by frontside layers 52 built-up over die body 48 as previously discussed. Specialized transistor designs or layouts may be utilized to allow such a frontside I/O interface for an RF power die, two examples of which are described below in connection with FIGS. 3 and 4. In the following description, transistor ICs containing a single FET are discussed for purposes of explanation. In further embodiments, other types of transistors (e.g., bipolar transistors) may be formed on RF power die 22 and/or more complex transistor ICs, such as multi-stage transistor ICs containing multiple transistors formed on a single RF power die, can be employed. In this regard, embodiments of the present disclosure can be utilized with various different die technologies, transistor types, and transistor layouts. For example, when the transistor or transistors carried by RF power die 22 assume the form of a FET (e.g., FET 44 generically shown in FIG. 1), the FET can be implemented utilizing any of the following die technologies: a silicon-based FET (e.g., a laterally-diffused metal oxide semiconductor FET or LDMOS FET) or a III-V FET (e.g., a GaN FET, a gallium arsenide (GaAs) FET, a gallium phosphide (GaP) FET, an indium phosphide (InP) FET, or an indium antimonide (InSb) FET, or another type of III-V transistor). Embodiments the present disclosure may be particularly useful when the RF power die or dies contained within a PAM (e.g., RF power die 22 contained in PAM 18) is prone to excess heat generation during operation, as may be the case when RF power die 22 is fabricated utilizing a power dense (e.g., GaN) die technology and/or when RF power die 22 operates at higher radio frequencies, such as frequencies approaching or exceeding 3 GHz.

Turning now to FIGS. 3 and 4, two possible FET layouts or structures 86, 88 having frontside I/O interfaces are shown. Referring first to FET structure 86 (FIG. 3), FET structure 86 is formed in and above a body of semiconductor material 90, which may form a part or the entirety of die body 48 shown in FIG. 1. Certain regions of semiconductor material 90 are doped to define the source and drain regions of FET structure 86; e.g., as seen looking downwardly onto the principal surface of the semiconductor region in which the channel of FET structure 86 is formed, each source region may be located between or laterally bordered by two drain lines and two underlying drain regions, which are, in turn, located between or bordered by two of the gate contact fingers. A patterned metal layer (hereafter, the "M1 layer") is initially formed over upper surface 92 of semiconductor material body 90 to define the contact features of FET 86. FET contact features include a drain manifold 94, a plurality of gate manifold sections 96, and a plurality of source contact sections 98. Gate manifold sections 96 are interspersed with source contact sections 98, as taken along the X-axis of coordinate legend 42 (the axis along which FET 86 is elongated in the present example). Within a central interdigitated contact line array 100, a plurality of drain lines extending from drain manifold 94 are interdigitated with a plurality of gate contact fingers extending from gate manifold sections 96. Gate manifold sections 96, source contact sections 98, and drain manifold 94 are located adjacent or border interdigitated contact line array 100 to provide a relatively compact transistor layout, with all transistor terminals facing the frontside of the RF power die. FET 86 may be formed to include various other contact features, as appropriate, such as gate biasing contacts 102. As drain manifold 94, gate manifold 96, and source contact sections 98 are coplanar with a first patterned metal layer 104, additional patterned metal layers formed in frontside layers 50 may be built-up over the illustrated structure to define the wiring architecture of RF power die 22 and ultimately electrically connect transistor contact features 94, 96, 98 to bond pads 54, 56, 58 present at frontside 32 of RF power die 22.

Similarly, in the example of FIG. 4, another possible FET structure 88 supportive of a frontside I/O interface is presented. Once again, FET structure 88 includes a drain manifold 106, a gate manifold 108, and two source contact sections 110. As was previously the case, a plurality of elongated fingers or lines extend from manifolds 106, 108 to produce a central interdigitated transistor finger or line area 112. All of the foregoing features may be formed by patterning of an M1 layer 114, which is deposited onto a frontside or upper principal surface 116 of a body of semiconductor material 118. Additional electrically-conductive features, such as gate bias contacts 120, may also be formed by patterning of M1 layer 114. Prior to deposition of M1 layer 114, the appropriate regions of semiconductor material body 118 are doped to define the source and drain regions of FET structure 88 in a manner analogous to that previously described. Finally, various additional patterned metal layers are subsequently built-up over surface 116 and first patterned metal layer 114 to produce the wiring structure of frontside layer 50 (FIG. 1) and complete the wiring structure of RF power die 22. Source contacts 110 are thus located adjacent interdigitated transistor line area 112, as are gate and drain manifolds 106, 108. The end result is a relatively compact FET layout in which all transistor terminals face the frontside of the RF power die to enable the formation of a frontside I/O interface, as previously described. Various other FET layouts are also in further embodiments. Additionally, in further implementations, it is possible for at least one of the electrically-active regions of FET structure 88 (e.g., the source region) to be electrically coupled through backside 40 of RF power die 22, in which case topside thermal extension 28 may be electrically active and utilized as a terminal of PAM 18.

Further relating FET structure 86 (FIG. 3) and FET structure 88 (FIG. 4) to PAM 18 shown in FIG. 1, the contacts or terminals of FET structures 86, 88 are electrically coupled to one or more of bond pads 54, 56, 58. Specifically, in an example embodiment in which FET structure 86 (FIG. 3) is formed in RF power die 22, gate contacts 96 are electrically coupled to a first of bond pads 54, 56, 58; source contacts 98 are electrically coupled to a second of bond pads 54, 56, 58; and drain manifold 94 is electrically coupled to a third of bond pads 54, 56, 58. Similarly, in an example embodiment in which FET structure 88 (FIG. 3) is formed in RF power die 22, gate manifold 108 is electrically coupled to a first of bond pads 54, 56, 58; source contacts 110 are electrically coupled to a second of bond pads 54, 56, 58; and drain manifold 106 is electrically coupled to a third of bond pads 54, 56, 58. The electrical interconnections between the contacts or terminals of FET structures 86, 88 (or another FET structure formed in RF power die 22) and bond pads 54, 56, 58 are provided by electrically-conductive features formed in frontside layers 50, which are built-up over the surface of die body 48 along which the transistor is formed (corresponding to FET 44 generically shown in FIG. 1). Again, such frontside layers 50 may be formed during wafer level processing after the appropriate doping and other processes carried-out to produce the desired FET structure, such as FET structure 86 or FET structure 88 shown in FIGS. 3 and 4, respectively. In further embodiments, the transistor or transistors integrated into RF power die 22 may have a different structure or layout, including a structure or layout providing electrical connection (e.g., through one or more TSVs) to the backside 40 of RF power die 22; e.g., for grounding purposes in embodiments in which one or more FETs are integrated into RF power die 22, as further discussed below.

Progressing next to FIG. 5, there is shown an overarching process 122 for fabricating a plurality of PAMs similar or identical to PAM 18 (FIG. 1) and for installing one or more of the resulting PAMs in an electronic assembly. Process 122 includes a number of process STEPS 124, 126, 128, 130, 132, 134, 136, 138, 140, 142, which are described, in turn, below. Depending upon the particular manner in which process 122 is implemented, each step generically illustrated in FIG. 5 may entail a single process or multiple subprocesses. Further, the steps illustrated in FIG. 5 and described below are provided by way of non-limiting example only. In alternative embodiments of process 122, additional process steps may be performed, certain steps may be omitted, and/or the illustrated process steps may be performed in alternative sequences. Overarching process 122 is divided into two subprocesses: a PAM fabrication subprocess 144, and a PAM installation subprocess 146. In embodiments, a single manufacturer or entity may perform both subprocesses 144, 146, at least in substantial part More commonly, however, a first entity (e.g., a supplier) will carry-out PAM fabrication subprocess 144, while a second entity (e.g., a customer or purchaser) conducts PAM installation subprocess 146. It is also possible for multiple entities to perform various other combinations of the steps included in overarching process 122 and other related processes; e.g., a third entity (e.g., a chip maker) may initially fabricate the RF power dies integrated into the PAMs produced pursuant to subprocess 144. Overarching process 122 is described in conjunction with FIGS. 5-11, with reference numerals carried-over from FIGS. 1 and 2 as appropriate. While described in connection with example PAM 18 (FIGS. 1 and 2) for purposes of explanation, overarching process 122 and, specifically, PAM fabrication subprocess 144 can be utilized to PAMs that differ relative to PAM 18 in various respects.

Figure 6:
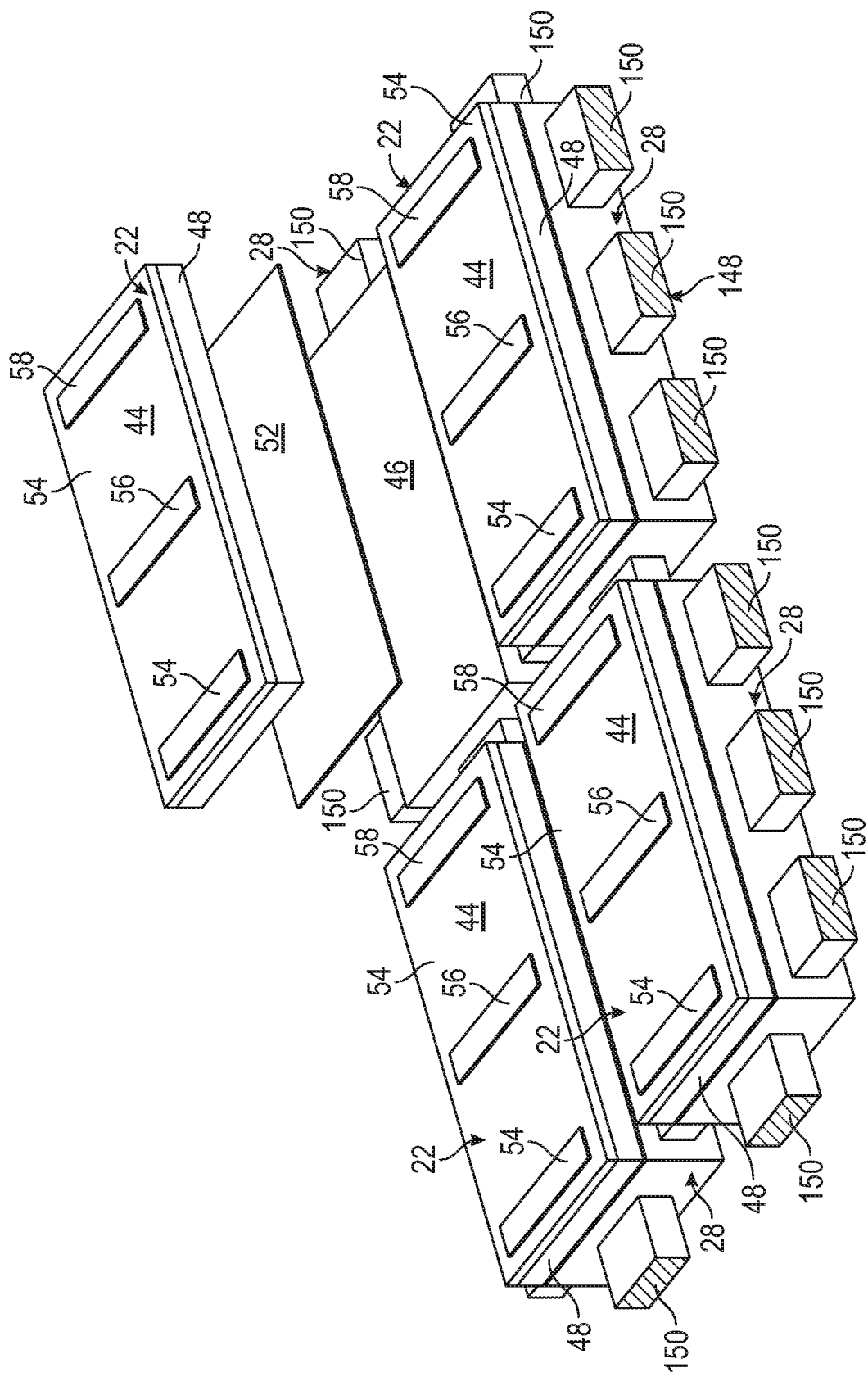
FIGS. 6-10 illustrate a limited number of PAMs at various stages of completion and fabricated to include topside cooling interfaces in accordance with the example PAM fabrication subprocess set-forth in FIG. 5.

Referring collectively to FIGS. 5-11, overarching process 122 (FIG. 5) commences with STEP 124 of PAM fabrication subprocess 144. During this step, one or more RF power dies 22 are obtained by independent fabrication, by purchase from a supplier, or in another manner. RF power dies 22 have been fabricated by wafer processing to define the features described above in connection with FIG. 1; e.g., the desired transistor IC has been formed in each of RF power dies 22, frontside layers 50 have been built-up over die 48 body of each RF power die 22, and a plurality of bond pads 54, 56, 58 forming the frontside I/O of each die 22 have been produced. RF power dies 22 may or may not be fabricated to provide additional I/O connection (e.g., grounding) through die backsides 40. During STEP 124 of example subprocess 144, topside thermal extensions 28 are bonded to backsides 40 of RF power dies 22. As noted above, topside thermal extensions 28 can be produced by plating or otherwise directly depositing a thermally conductive material onto backsides 40 of RF power dies 22 in embodiments. Alternatively, topside thermal extensions 28 may be provided as prefabricated structures, which are bonded to backsides 40 of RF power dies 22 during STEP 124 of PAM fabrication subprocess 144. Accordingly, in one possible approach in which a panel-level assembly is employed for manufacturing efficiency, a thermal extension panel 148 containing a plurality of interconnect topside thermal extensions 28 may be obtained. A limited portion of such a panel 148 is shown in FIG. 6, which includes four topside thermal extensions 28 interconnected by spars or tie bars 150. Tie bars 150 physically interconnect topside thermal extensions 28, while having a reduced thickness relative thereto to facilitate subsequent singulation of thermal extension panel 148, such as by sawing, as described below in connection with STEP 128.

In the illustrated process flow, RF power dies 22 are bonded to lower surfaces 46 of topside thermal extensions 28, while topside thermal extensions 28 remain interconnected as thermal extension panel 148. As shown in the exploded upper right quadrant of FIG. 6, each RF power die 22 may be bonded to a lower surface 46 of its corresponding topside thermal extension 28 utilizing a layer of bonding material 52. As noted previously, thermally-conductive bonding material 52 can assume any form suitable for mechanically attaching each die 22 to its corresponding topside thermal extension 28, while also having a relatively high thermal conductivity exceeding, for example, 30 W/mk or, perhaps 100 W/mk. In embodiments, thermally-conductive bond layer 52 may be applied as a freestanding film, which is applied to backside 40 of each RF power die 22 before placement over lower surface 46 of topside thermal extensions 28; or, instead, applied to lower surfaces 46 of topside thermal extensions 28 prior to placement of RF power dies 22 thereover. In this latter regard, thermally-conductive bond layers 52 may be applied globally as a panel-level film spanning panel 148 for processing efficiency in embodiments, in which case the individual bond layers 52 may be separated during the below-described singulation process. In other instances, thermally-conductive bond layers 52 may be formed in another manner, such as by applying a sinter precursor material (e.g., a material containing metal particles and other constituents, such as a liquid carrier) and then heat treating the sinter precursor material to form a sintered bond layer. In such embodiments, backsides 40 of RF power dies 22 may be plated with backmetal layers and/or selected surfaces of topside thermal extension 28 may be plated with a material (e.g., a nickel pallidum gold (NiPdAu) alloy) to promote the formation of robust, high thermal conductivity metallurgical bonds at the corresponding interfaces. In still other embodiments, thermally-conductive bond layer 52 may be composed of a solder material; e.g., a solder finish can be applied to lower surface 46 of topside thermal extensions 28 or a solder paste may be applied to either lower surfaces 46 of topside thermal extensions 28 or backsides 40 of RF power dies 22 prior to die placement over panel 148. A solder reflow process may then be performed to form thermally-conductive bond layers 52.

Figure 7:
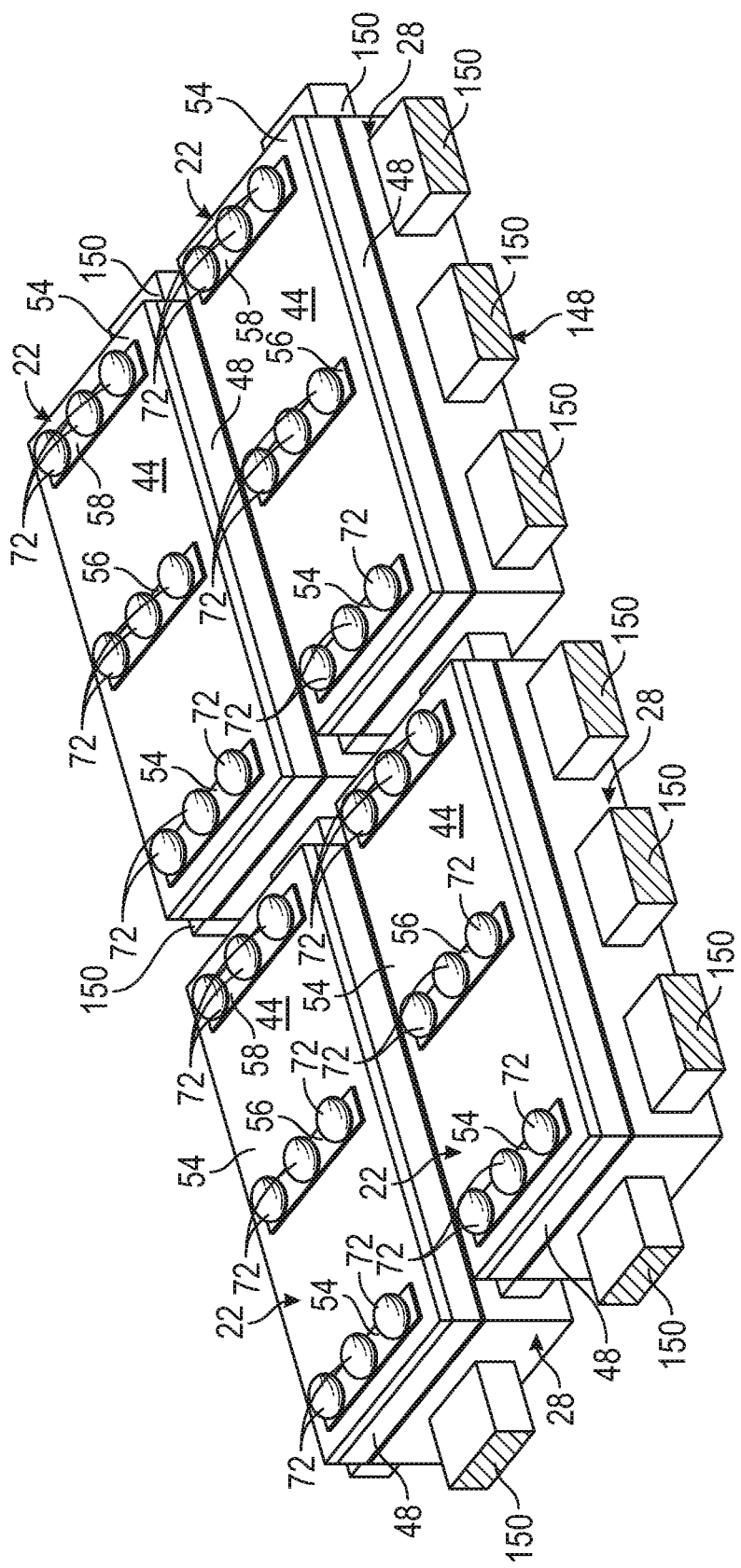

Continuing to STEP 126 of PAM fabrication subprocess 144 (FIG. 5), contact extensions are next formed over bond pads 54, 56, 58 of each RF power die 22. As shown in FIG. 7, one or more contact extensions 72, such as solder bumps or balls, may be formed in contact with each bond pad 54, 56, 58. In certain embodiments, an overmolding process may be performed prior to deposition of contact extensions 72 to create a molded body encapsulating RF power dies 22. In this case, the molded body may initially be deposited to have an excessive thickness or overburden covering the frontside I/O interface of RF power dies 22 (here, bond pads 54, 56, 58). Bond pads 54, 56, 58 may then be exposed prior to deposition of contact extensions 72 by thinning (e.g., back-grinding) the molded panel in a manner analogous to that described below in connection with FIG. 10 and STEP 134 of PAM fabrication subprocess 144. After this, PAM fabrication subprocess 144 progresses to STEP 128 during which thermal extension panel 148 is singulated, such as by sawing, water jetting, or laser cutting, to yield a plurality of partially-fabricated PAMs 18'; the prime symbol (') appended to reference numeral 18 to indicate that PAMs remain in an incomplete or partially-fabricated state as this juncture of the fabrication process. The resulting structure is depicted in FIG. 8.

Figure 8:
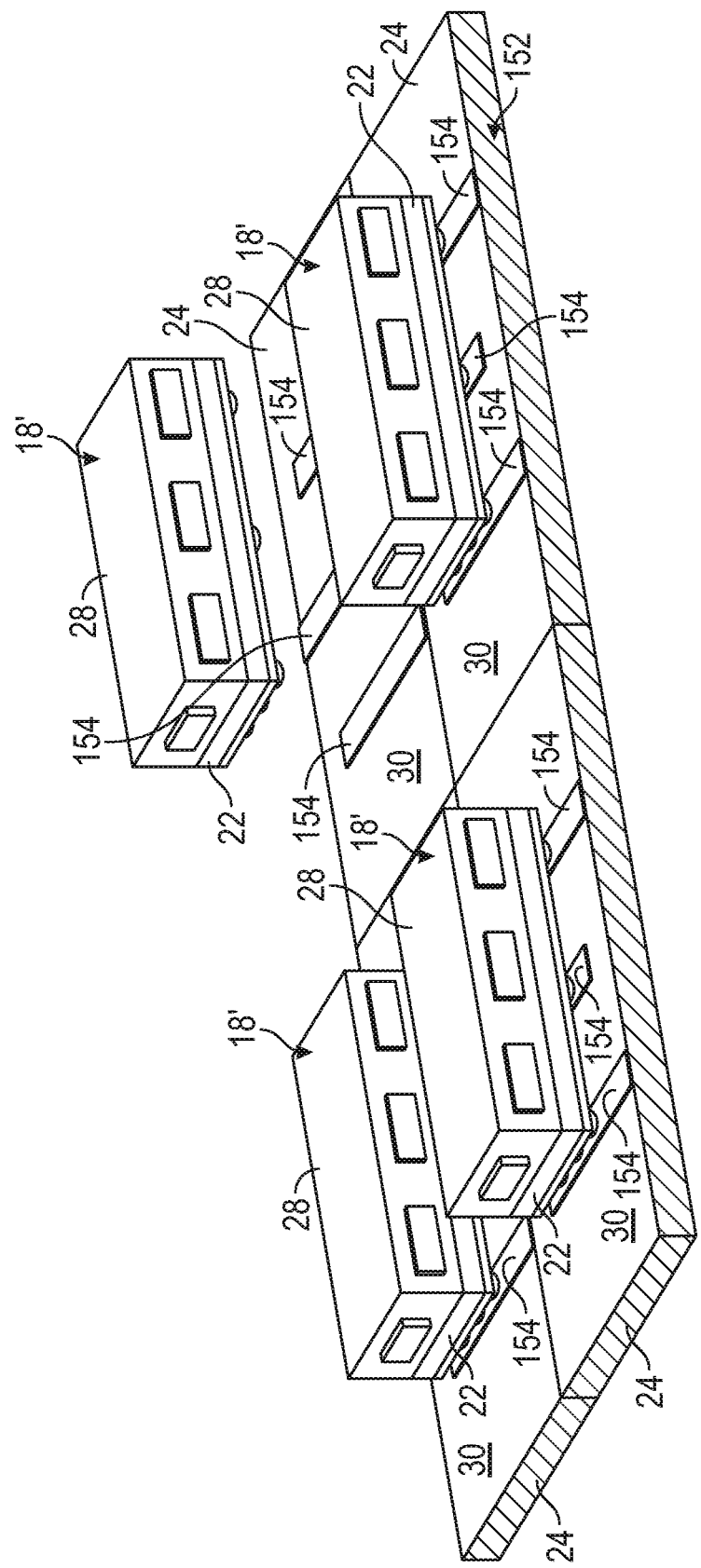

Referring to FIG. 8, four partially-fabricated PAMs 18' following the singulation process performed at STEP 128 of PAM fabrication subprocess 144 are shown. Next, and as also indicated in FIG. 8, partially-fabricated PAMs 18' are attached to a module panel 152 composed of a plurality of interconnected module substrates 24 (the boundaries between which are shown in FIG. 8 for added visual clarity). Here, it can be seen that module substrates 24 include interconnect features 154 (e.g., bond pads and associated interconnect lines or traces) for electrical connection to solder contacts 72 or other contact extensions, which were previously deposited onto bond pads 54, 56, 58 of each partially-fabricated PAMs 18' during STEP 126 (FIG. 7). Accordingly, during STEP 130, partially-fabricated PAMs 18' are attached to module substrate panel 152 in a manner mechanically joining at least one of PAMs 18' to one of the interconnected module substrates 24, while providing the desired electrical connections between solder contacts 72 and the corresponding contact features 154 provided on the respective frontsides or die support surfaces 30 of module substrates 24. Conveniently, this may be accomplished by positioning each partially-fabricated PAMs 18' in the appropriate location over module substrate panel 152 utilizing a pick-and-place tool. Afterwards, a solder reflow process may be carried-out to physically attach and electrically interconnect PAMs 18' with module substrates 24, while interconnected as panel 152.

Figure 9:
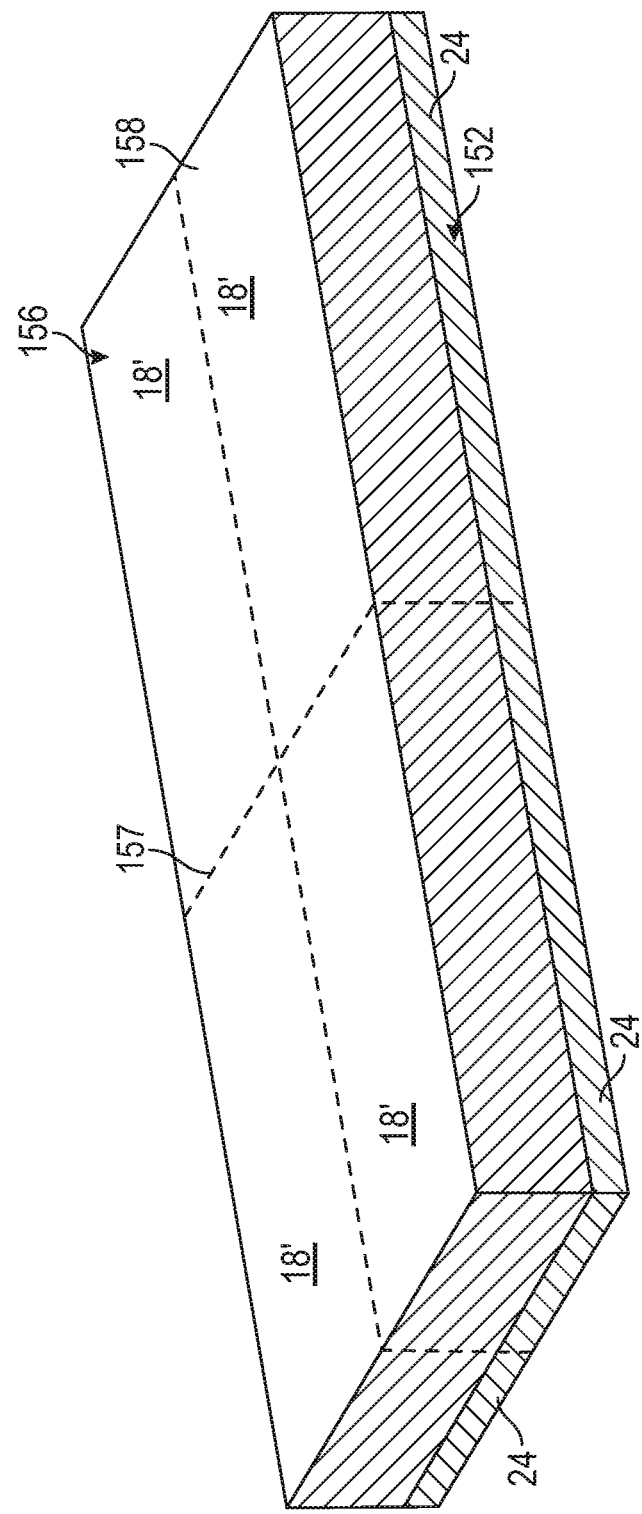
Figure 10:
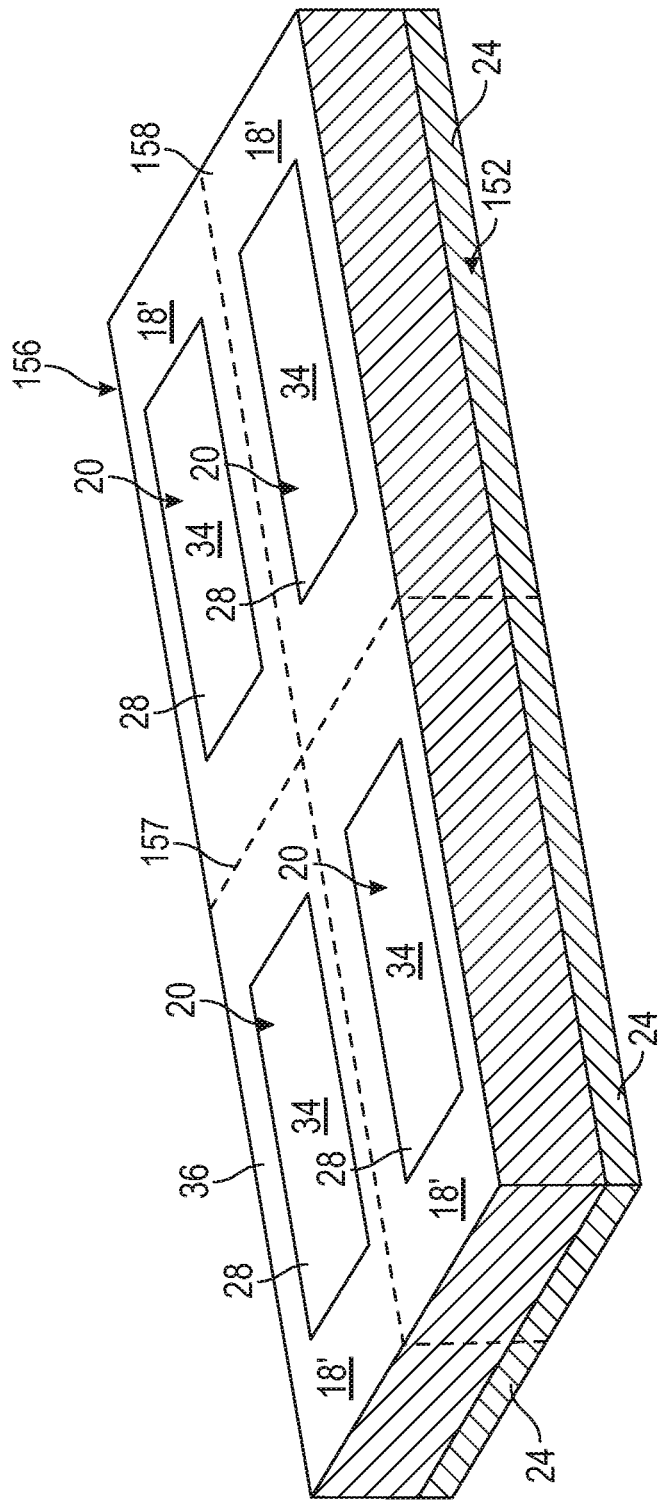

Advancing to STEP 132 of PAM fabrication subprocess 144 (FIG. 5), partially-fabricated PAMs 18' are overmolded to produce a molded panel 156, as shown in FIG. 9. Molded panel 156 encapsulates all partially-fabricated PAMs 18' previously mounted to panel 152 during STEP 130 of subprocess 144, with the boundaries between partially-fabricated PAMs 18' generally designated by dashed lines 157 in FIG. 9 for visual clarity. Molded panel 156 is formed to have an excessive thickness or overburden, which fully encapsulates PAMs 18' to cover upper surfaces 34 of topside thermal extensions 28. After this, molded panel 156 is thinned by removing material from panel frontside 158 during STEP 134 of PAM fabrication subprocess 144. A back-grinding process may be utilized for this purpose, with the term back-grinding encompassing various grinding and polishing processes suitable for removing material from molded panel 156 in a controller manner. The upper principal surface or frontside 158 of molded panel 156, and thus molded module bodies 26 presently joined as panel 156, are back-ground to expose the respective upper surfaces 34 of topside thermal extensions 28, with the resultant structure shown in FIG. 10. This yields a plurality of plurality of molded bodies 26 having upper surfaces or frontsides 36, which are substantially coplanar with exposed surfaces 34 of topside thermal extensions 28 and which define topside cooling interfaces 20. Finally, at STEP 136, molded panel 156 and module panel 152 are singulated to yield a plurality of PAMs 18 and complete PAM fabrication subprocess 144.

In certain embodiments, additional steps may also be conducted in furtherance of PAM fabrication subprocess 144, as indicated by STEP 142 in FIG. 5. For example, in at least some implementations, a thermally-conductive adhesive layer may be applied over the respective topside cooling interfaces 20 of PAMs 18 to facilitate customer attachment of an assembly-level heatsink in embodiments. Such a step can be performed following panel singulation at STEP 136 of subprocess 144; or, instead, prior to panel singulation for increased process efficiency. In one approach, a thermally-conductive adhesive layer is applied along with a removable backing in sheet form prior to singulation of panels 152, 156, with each adhesive layer and its corresponding backing then separated during the singulation process. In another approach, a thermally-conductive adhesive layer may be applied to topside cooling interfaces 20 in a different manner, such as by spray-on deposition.

At some juncture following PAM fabrication, a given PAM 18 produced pursuant to subprocess 144 may be installed within a larger electronic assembly or system. Proceeding to PAM installation subprocess 146, a given PAM 18 may be mounted to an assembly-level substrate, such as a motherboard, during STEP 138 of subprocess 146 (FIG. 5). An example of such an assembly-level substrate is substrate 78 previously described in connection with FIG. 2. Prior to, after, or concurrent with mounting of PAM 18 to assembly-level substrate 78, topside cooling interface 20 is thermally coupled to assembly-level heatsink external to PAM 18 (STEP 140, FIG. 5), such as heatsink 82 shown in FIG. 2. Additional steps are then performed, as appropriate, to complete fabrication of the electronic assembly to complete subprocess 146; e.g., additional PAMs, other semiconductor dies, or other microelectronic components (e.g., SMDs) may be mounted to the motherboard, any other electrical interconnections may be formed, testing may be performed, and other such steps may be carried-out.

Figure 11:
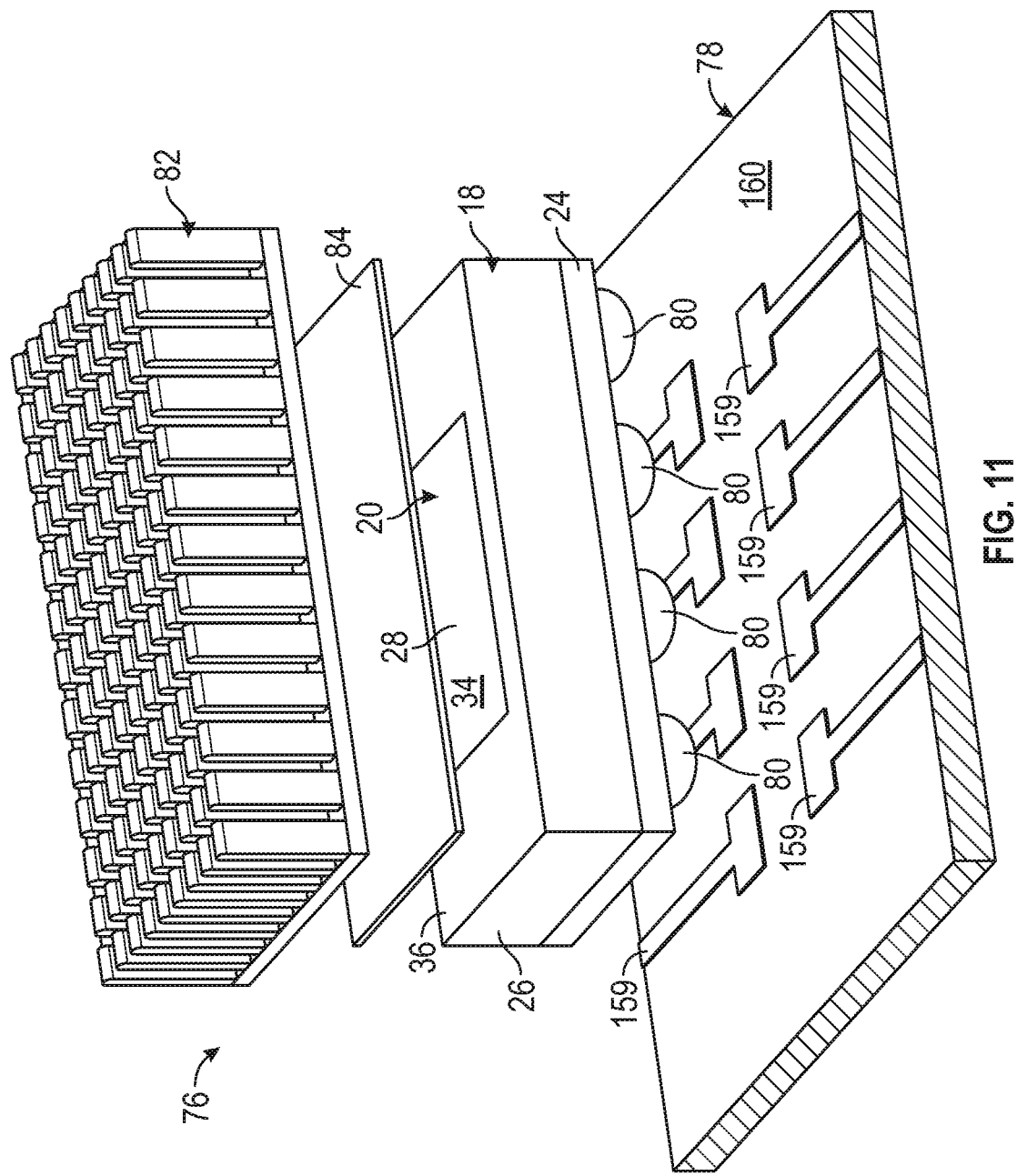
FIG. 11 illustrates one manner in which a PAM fabricated in accordance with the example PAM fabrication subprocess set-forth in FIGS. 5-10 may be installed within an electronic assembly in accordance with the example PAM integration subprocess further set-forth in FIG. 5.

FIG. 11 is an exploded view of electronic assembly 76 illustrating the performance of STEPS 138, 140 in an embodiments. Here, it can be seen that a layer of thermally-conductive material 84 may be utilized to attach assembly-level heatsink 82 to PAM topside 34, 36 and, therefore, to topside cooling interface 20 during STEP 140 of subprocess 146 (FIG. 5). Thermally-conductive bond layer 84 may be composed of a compliant, thermally-conductive material to allow conformal contact along the interfaces between assembly-level heatsink 82 and PAM topside 34, 36 accommodating any uneven or non-planar surface topologies. Before or following heatsink attachment, during STEP 138 of subprocess 146, the external terminals or contacts located on the bottomside of PAM 18 are interconnected with corresponding contacts (e.g., bond pads) on a frontside or a module support surface 160 of assembly-level substrate 78. As noted above, any interconnection technique can be utilized to interconnect the I/O interface on the bottomside of PAM 18 with module support surface 160 of assembly-level substrate 78; e.g., as shown in FIG. 11, a BGA 80 may be utilized to mount PAM 170 to module support surface 160, while providing the desired electrical interconnection. Such a structural arrangement thus allows highly efficient dissipation of heat generated by RF power die(s) 22 from within PAM 18 along a primary heat extraction path extending in a generally upward direction from the backside(s) of the inverted RF power die(s) 22, through bond layer 52, through topside thermal extension 28, through topside cooling interface 20, and ultimately to assembly-level heatsink 82. Concurrently, signal and power transmission (potentially including grounding one or more FETs carried by RF power die 22) is routed downwardly from the RF power die 22, through module substrate 24, and ultimately to the interconnect features provided on assembly-level substrate 78.

Additional Example PAMS Having Electrically-Active Topside Thermal Extensions

As previously indicated, embodiments of the PAM may or may not contain a topside thermal extension. When lacking a topside thermal extension, the backside of the RF power die (or dies) contained in the PAM may be directly exposed through the PAM topside (e.g., by back-grinding a molded panel, as described above in connection with FIG. 10) to define the topside cooling interface of the PAM. When including a topside thermal extension, the topside thermal extension may or may not be electrically-active; that is, utilized for electrical signal or power conduction purposes during operation of the PAM. Various benefits can be achieved by not utilizing the topside thermal extension for power or signal conduction and instead exclusively forming the I/O interface of an RF power die on the die frontside. Such benefits are discussed above and may include cost reduction through the elimination of TSVs within the RF Power die, elimination of any need for Au-containing bond pads, and simplified routing schemes supported by unique transistor designs, such as the FET layouts discussed above in connection with FIGS. 3 and 4. This notwithstanding, it may be desirably to provide electrical connection through the backside of an RF power die and any topside thermal extension bonded thereto in alternative embodiments. For this reason, additional description of embodiments in which the topside thermal extension is utilized for signal or power (e.g., grounding) purposes will now be described with reference to FIGS. 1, 2, and 12, 13.

Referring briefly once again to FIGS. 1 and 2, an example manner for forming an electrically-conductive path extending from topside thermal extension 28 to module substrate 24 is depicted. In this example, the dimensions of topside thermal extension 28 are enlarged such that topside thermal extension 28 includes an peripheral overhang portion 164 (shown in phantom), which projects beyond RF power die 22 in at least one planform dimension (here, as taken along the X-axis of coordinate legend 42). For clarity, peripheral overhang portion 164 is shown as projecting beyond a single side (the depicted left side) of RF power die 22 in FIGS. 1 and 2. However, topside thermal extension 28 can likewise be dimensioned to extend over the opposing side of RF power die 22, as taken along the X-axis of coordinate legend 42; and/or to extend over the other sides of RF power die 22, as taken along the Y-axis of coordinate legend 42. As further indicated in phantom, at least one discrete, vertically-extending contact 166 may be positioned at the juncture between peripheral overhang portion 164 and one or more interconnect features 168 (FIG. 1) of the module substrate 24. Vertically-extending contact 166 has a height sufficient to span the vertical gap between the underside of peripheral overhang portion 164 and a vertically-aligned bond or landing pad included in interconnect features 168; again, the term "vertical" referring to a direction parallel to the centerline of PAM 18 and the Z-axis of coordinate legend 42. Vertically-extending contact 166 can be, for example, a relatively large solder ball or a discretely-placed electrically-conductive piece, such as a metallic (e.g., Cu) block or column. When assuming the form of a discrete electrically-conductive piece, vertically-extending contact 166 may be bonded to peripheral overhang portion 164 and to the aligning bond pad utilizing any suitable electrically-conductive bonding material and process; e.g., a solder paste, a solder finish provided on the Cu block, a metal particle-containing epoxy, or an electrically-conductive die attach material. In still other embodiments, a different interconnection technique can be utilized to electrically coupe peripheral overhang portion 164 to one or more interconnect features on module substrate 24 including, for example, wire bonding; e.g., as may be practiced when topside thermal extension 28 is formed to include a recessed bond pad shelf projecting from one or more sides of extension 28.

The above-described a structural configuration enables the provision of a broader electrically-conductive path from die backside 40, through bond layer 52 (here, formed from an electrically-conductive material), through topside thermal extension 28, through vertically-extending contact 166, and to module substrate 24. In embodiments in which RF power die 22 contains at least one FET, such as FET 44, the source terminal of the FET may be electrically coupled to routing feature 168 on module substrate 24 through die backside 40, through bond layer 52, through topside thermal extension 28, and through vertically-extending contact 166. When PAM 18 is installed in a larger assembly, such as assembly 76 shown in FIG. 2, a reference voltage (e.g., electrical ground) may further be electrically coupled to the source terminal of the FET through the above-described electrical path. In other embodiments, a different terminal of the FET or FETs (or another transistor type) formed in RF power die 22 may be electrically coupled to corresponding interconnect features on module substrate 24 through topside thermal extension 28 in this manner. In still other instances, such an electrical (e.g., ground) connection through topside thermal extension 28 and to backside 40 of RF power die 22 may be provided through assembly-level, assembly-level heatsink 82.

Figure 12:
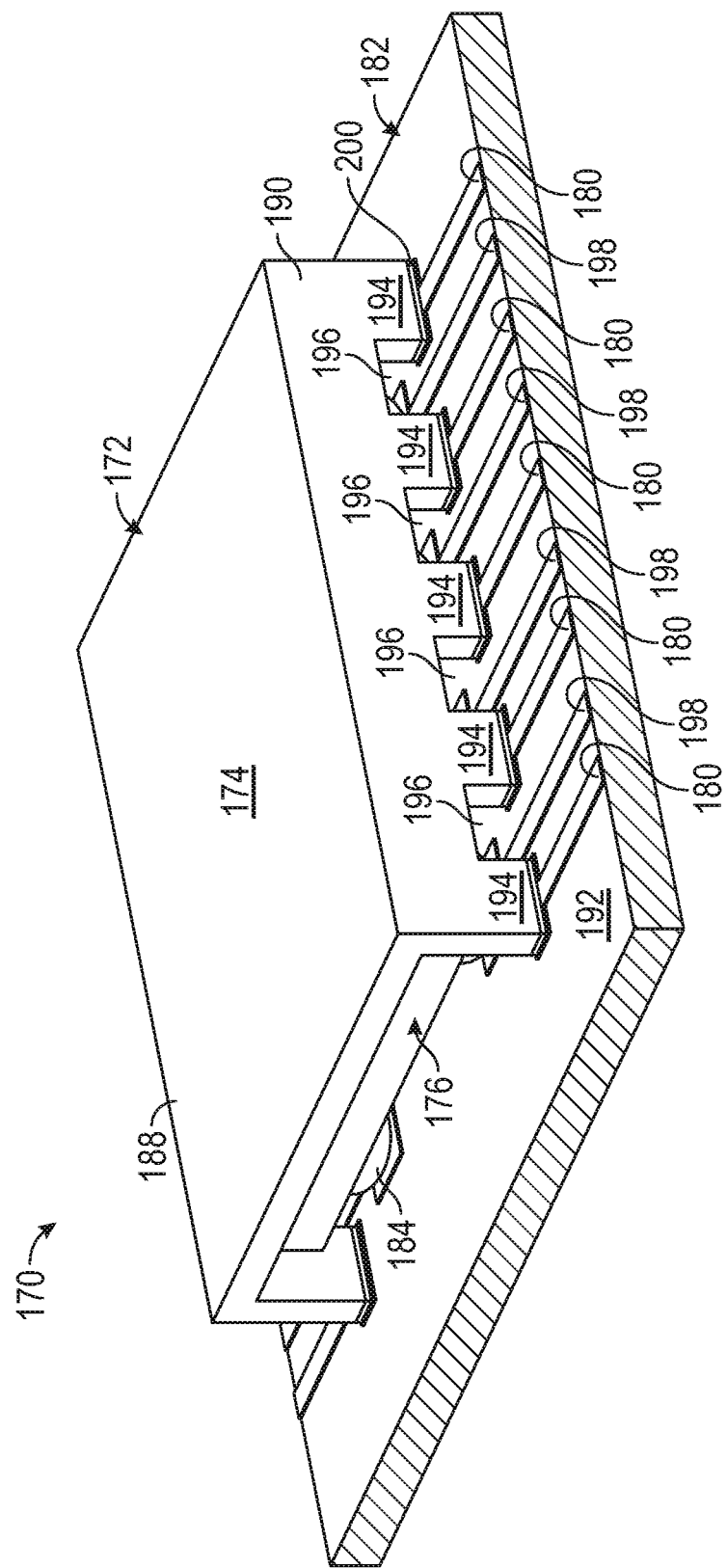
FIGS. 12 and 13 are isometric and exploded views, respectively, of a partially-fabricated PAM module including a topside thermal extension in the form of an electrically-conductive clip, which may provide electrical interconnection with the module substrate in further embodiments.
Figure 13:
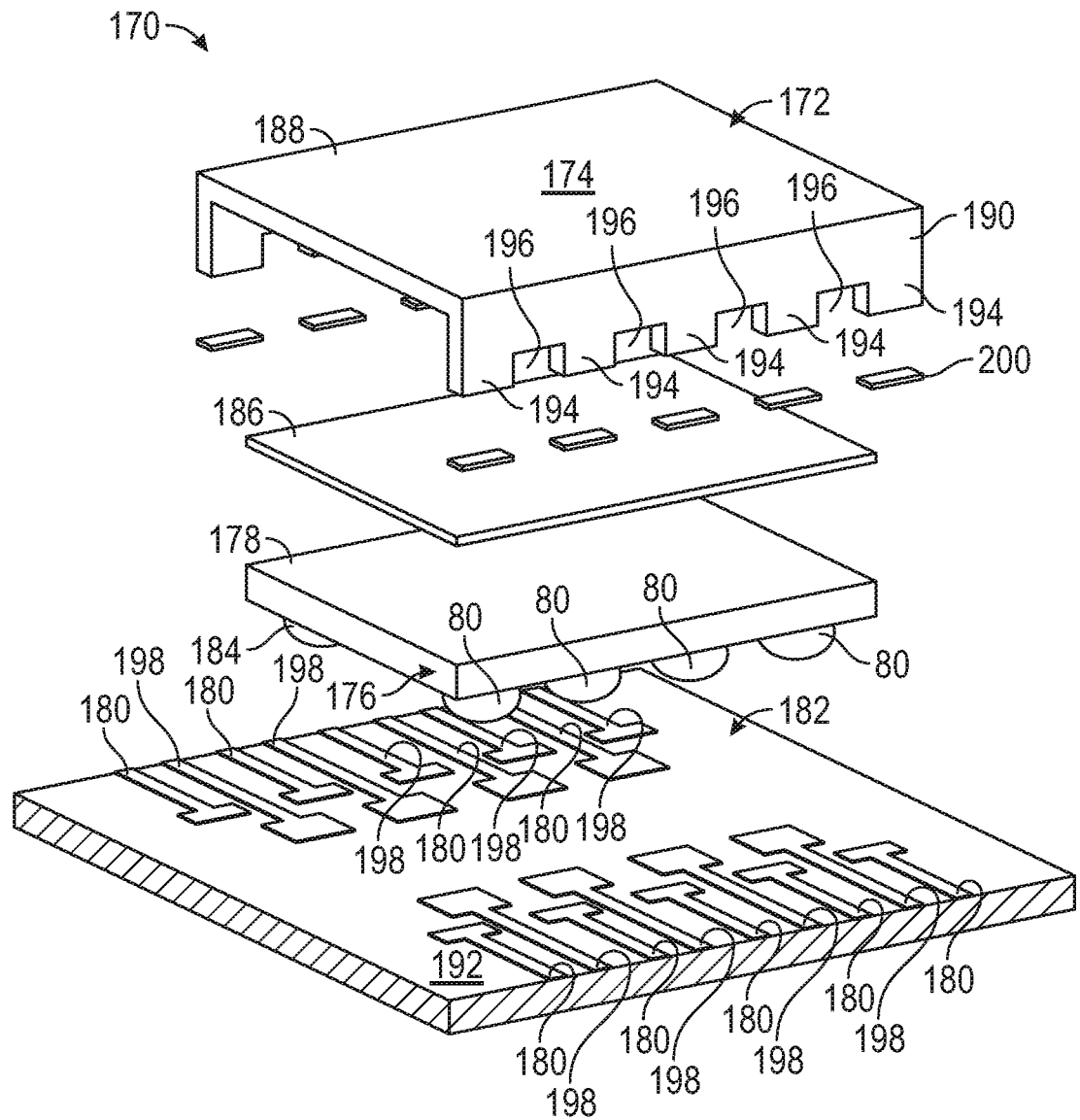
Figure 14:
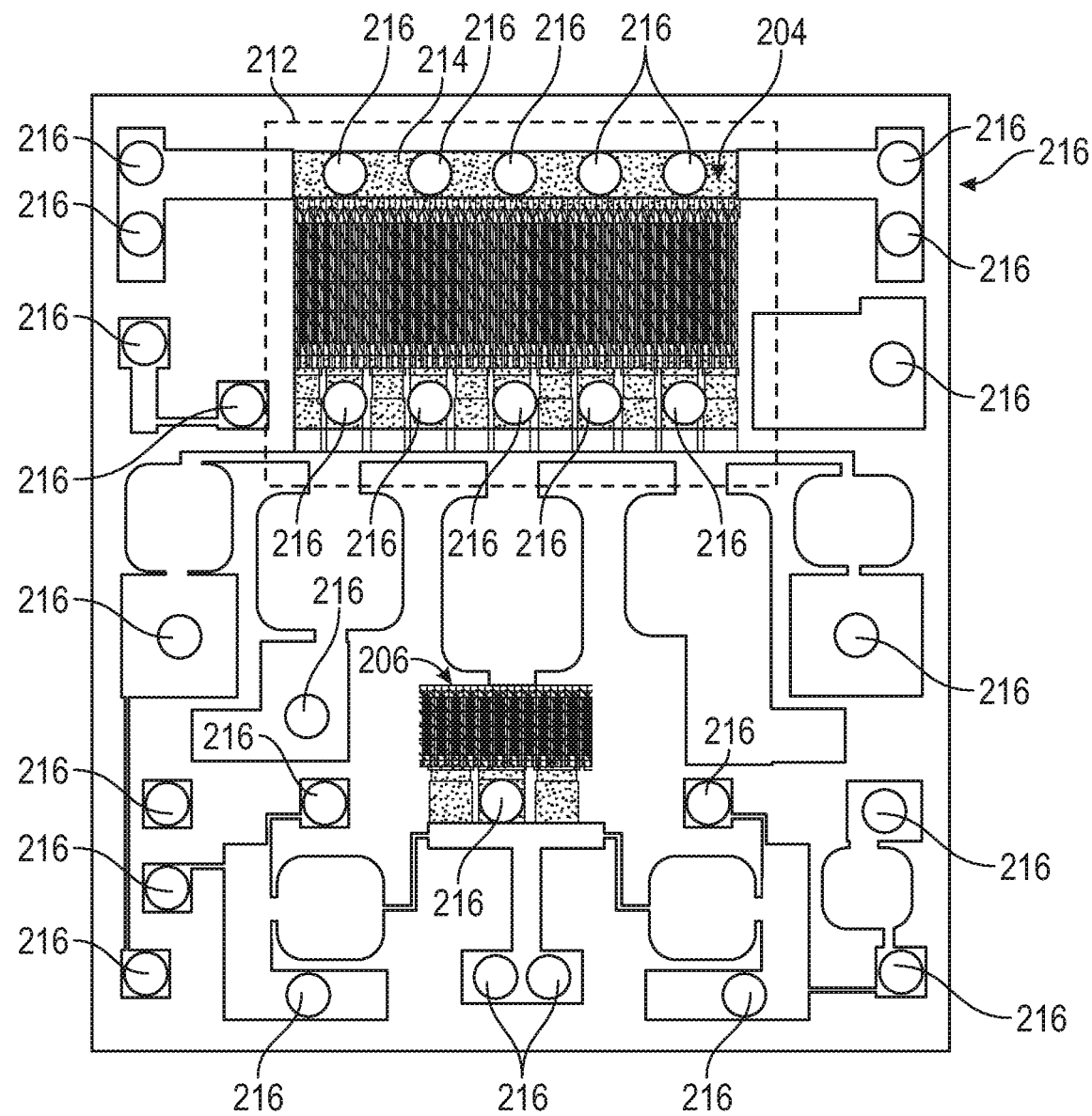
FIG. 14 is a planform view of a multi-stage power amplifier integrated circuit suitably incorporated into a PAM having a topside cooling interface, such as any of the PAMs shown in FIGS. 1-4 and 6-13, in additional implementations of the present disclosure.

FIGS. 12 and 13 are isometric and exploded views, respectively, of a partially-fabricated PAM 170 including a topside thermal extension in the form of an electrically-conductive clip 172, as illustrated in accordance with a further example embodiment of the present disclosure. PAM 170 is shown in an intermediate manufacturing stage in FIGS. 12 and 13, which corresponds to the manufacturing stage shown in FIG. 8 and described above in connection with fabrication of PAM 18. Following the manufacturing stage shown in these drawing figures, PAM 170 may be subject to overmolding (analogous to the process shown in FIG. 9), back-grinding to expose an upper surface 174 of clip 172 (analogous to the process shown in FIG. 10), and then panel singulation to yield a completed PAM having a topside thermal interface. In many respects, PAM 170 is similar, if not identical to PAM 18 described above in connection with FIGS. 1-11. For example, PAM 170 includes an RF power die 176 having a backside 178 (FIG. 13) and an opposing frontside (hidden from view). The bond pads on the frontside of RF power die 176 are electrically coupled to corresponding electrically-conductive interconnect features 180 provided on a module substrate 182, such as a PCB, utilizing a plurality of electrically-conductive contacts, such as a printed solder paste layer or an array of solder balls 184. Once again, backside 178 of RF power die 176 is bonded to the underside of a topside thermal extension (here, electrically-conductive clip 172) utilizing a thermally-conductive bond layer 186 (FIG. 13). In this particular example, thermally-conductive bond layer 186 is composed of a material that is both electrically conductive and thermally conductive to permit signal or power conduction from die backside 178, through bond layer 186, through electrically-conductive clip 172, and to module substrate 188.

In contrast to topside thermal extension 28 of PAM 18 (FIGS. 1-11), electrically-conductive clip 172 includes a main body 188 and two sidewalls 190, which extend downwardly from body portion 188 toward an upper surface 192 of module substrate 188. Further, the lower edge portions of sidewalls 190 are castellated or toothed in the illustrated example to define a plurality of fingers 194 interspersed with a plurality of openings 196. Fingers 194 are further bonded to and electrically coupled to additional interconnect features 198 provided on upper surface 912 of module substrate 188 utilizing a patterned bond layer 200. Patterned bond layer 200 may be composed of a solder paste, a solder finish formed on at least the lower surfaces of fingers 194, an electrically-conductive die attach material, a sintered material, or another electrically-conductive bonding material. Electrically-conductive interconnect features 180 (e.g., traces) providing contact to the frontside I/O interface of RF power die 176 via solder balls 184 extend through openings 196 (or at least immediately beneath openings) to maintain electrical isolation between interconnect features 180, electrically-conductive clip 172, and interconnect features 198. In this manner, an electrically-conductive (e.g., grounding) path is again provided extending from die backside Electrically-conductive clip 172 can be composed of various different electrically-conductive materials, including Cu, Al, Ni, Al—SiC, and other metallic and non-metallic materials. While having a particular shape, as shown in FIGS. 12 and 13, the shape of electrically-conductive clip 172 can vary between embodiments; e.g., in further implementations, electrically-conductive clip 172 may have a box-like or cup-like shape including four lower sidewalls, which extend fully around the sides of RF power die 176 to enclose die 176. The particular manner in which electrically-conductive clip 172 is fabricated will vary based on the composition and shape of clip 172. However, by way of example, electrically-conductive clip 172 can be formed by extruding an elongated bar of material having the desired shape and then singulating the bar of material to form clip 172. The castellations defined by fingers 194 and openings 196 may then be created utilizing a suitable material removal process, such as stamping, laser cutting, or water jetting. In other instances, electrically-conductive clip 172 may be formed in parallel with a plurality of similar clips by metal sheet processing. Forging, pressing, or a similar technique may be utilized to bend such a metal sheet into the desired three dimensional geometry shown in FIGS. 12 and 13. In yet other embodiments, such a saw tooth or castellated edge of electrically-conductive clip 172 (or another topside thermal extension) may not be provided, with the requisite electrical isolation provided by routing the appropriate signal or power paths through the open sides of clip 172 or by routing the signals to a lower level (e.g., an interior layer or the backside) of module substrate 188, as needed. Again, such routing schemes may also be rendered unnecessary or simplified in embodiments in which the topside thermal extension contained in the PAM is electrically-inactive and does not risk bridging separate signal or power paths.

Alternative Embodiments of the High Thermal Performance PAM and Fabrication Methods The foregoing has thus described a method for fabricating high thermal performance PAMs including topside cooling interfaces in a streamlined, cost effective manner. Various other manufacturing methods are also possible in further embodiments. For example, in another approach, a topside thermal extension may be attached to the backside of an RF power die after populating a module substrate with RF power dies and any other microelectronic components included in a given PAM. In such embodiments, the topside thermal extensions may be bonded to a plurality of RF power dies, while the topside thermal extensions remain interconnected in panel form, as previously described. Overmolding may then be performed as described above in connection with FIG. 9. Afterwards, a singulation process analogous to that described above in connection with FIGS. 10 and 11 is conducted to separate the various panels into discrete PAMs having topside cooling interfaces. Other manufacturing approaches are also possible in which overmolding is not performed. For example, in such alternative embodiments, a different type of module enclosure (e.g., a lidded enclosure) may be utilized to enclose the RF power die and any other microelectronic components contained within a given PAM, while the topside thermal extension (if present) may be exposed from the exterior of the enclosure (e.g., the thermal extension may project through an opening in a lidded enclosure) to provide the desired topside cooling interface. It is also possible for RF power die (or dies) contained in a given PAM to be left non-enclosed (not housed within a molded body or a lidded enclosure), which may increase heat dissipation from the RF power die to some extent in certain instances. However, the formation of a die-surrounding enclosure, such a molded module body 26 described above, provides mechanical protection and structural integrity to the PAM. Additionally, such an enclosure may provide a substantially planar topside for facilitating manipulation utilizing a vacuum tool, such as a pick-and-place tool.

In the above described example, PAM 18 assumed a relatively simple form and contained a single illustrated RF power die (RF power die 22). In further embodiments, PAM produced in accordance with the present teachings can be considerably more complex, providing that the PAM includes at least one RF power die and a topside cooling interface through which heat generated by the die (and any number of other microelectronic components within the PAM) can be extracted. For example, in certain embodiments, PAM 18 may contain both peaking and carrier dies utilized in a Doherty power amplifier IC, which are attached to a massive multiple-input, multiple-output (MIMO) substrate. Further emphasizing this point, FIG. 12 is a top-down or planform view of a dual stage power amplifier IC 202 suitable for integration into a PAM of the type describe herein. In this example, the dual stage power amplifier IC 202 includes a primary transistor stage 204, a secondary transistor stage 206, and various other electronic components (only a few of which are labeled for clarity), such as shunt capacitors and bias circuitry. Such circuit components are formed in or mounted to a module substrate, such as a PCB 210. One or more topside thermal extensions (hidden from view in FIG. 12, but generally represented by phantom line 212) have previously been bonded to the backside of one or both of the RF power dies included in transistor stages 204, 206. The topside thermal extension or extensions 212 may be thermally coupled to the RF power dies through PCB 210 or an opening may be provided in PCB 210 through which the topside thermal extension projects for direct attachment to either or both of the RF power dies. In the illustrated example, specifically, a single topside thermal extension 212 is illustrated as positioned over an RF power die 214 included in primary transistor stage 204; e.g., this die 214 may be particularly susceptible to excess heat generation and accumulation and, thus, targeted for enhanced heat removal through topside thermal extension 212.

To integrate dual stage power amplifier IC 202 into a PAM having a frontside thermal interface, various contact extensions 216 (e.g. solder bumps or balls) may be deposited over the appropriate terminal or contacts of dual stage power amplifier IC 202; e.g., the drain pads, the shunt-L pads, the first and second stage source pads, the first stage gate pads, bias pads, and the shunt capacitors, to list but a few examples. With respect to shunt capacitors, in particular, the uppermost metal terminal or "top plate" may be connected to ground via such contact extensions 216 when dual stage power amplifier IC 202 is integrated into a PAM and ultimately installed in a larger electronic system or assembly. From the stage of manufacture shown in FIG. 12, the processes described above in connection with FIGS. 7-10 can be carried-out to complete production of a PAM containing dual stage power amplifier IC 202. For example, dual stage power amplifier IC 202 may be inverted and mounted (physically joined and electrically interconnected) with a module substrate, such as a second PCB; the assembly may then be overmolded to form a molded module body having an excessive thickness and fully covering the topside thermal extension 212; the molded module body may then be thinned by back-grinding to reveal the upper surface of topside thermal extension 212 from the topside of the PAM; and any additional steps may then be performed, as needed, to complete fabrication of the resulting PAM.

CONCLUSION

There has thus been provided PAMs having topside cooling interfaces, which facilitate thermal coupling of the topside cooling interface to an assembly-level heatsink when the PAM is installed in an electronic assembly. In so doing, the PAMs allow the efficient extraction from excess heat, as generated by at least one RF power die contained in the PAM, through the topside of the PAM. Concurrently, embodiments of the PAM route electrical signals and power supplied to the RF power die downwardly through a module substrate to which the RF power die is mounted, along with any number of additional components. The RF power die is mounted to the module substrate in an inverted orientation such that the frontside (frontside) of the RF power die faces the die support surface of the substrate. In addition to providing enhanced thermal performance, embodiments of the PAM may be amenable to low cost, streamlined manufacture utilizing, for example, a panel level fabrication and assembly process. Cost reductions may also be achieved in embodiments through the elimination of wire bond connections and/or TSVs formed through the RF power die, particularly when the backside of the RF power die and the topside thermal extension (if present) is electrically inactive. After production, the PAMs can be distributed to customers, which can then integrate the PAMs into various electronic systems or assemblies by forming the desired electrical interconnections with an assembly-level substrate (e.g., a PCB) and by thermally coupling (e.g., utilizing a thermally-conductive bonding material) an assembly-level heatsink, such as a chassis, a fin array, or another convectively-cooled structure, to the topside cooling interface of the PAM.

In embodiments, a method for fabricating a PAM includes independently fabricating, purchasing, or otherwise obtaining an RF power die including a frontside, a backside, and a frontside I/O interface on the frontside of the RF power die. The RF power die is attached to a die support-surface of a module substrate. The RF power die is attached to the module substrate in an inverted orientation such that the frontside of the RF power die faces the module substrate. When attaching the RF power die to the module substrate, the frontside I/O interface of the RF power die is electrically coupled to or interconnected with corresponding interconnect features of the module substrate. A primary heat extraction path is further formed to extend from the backside of the RF power die to a topside cooling interface of the PAM in a direction opposite the module substrate.

In further embodiments, a method for fabricating a plurality of PAMs includes the steps or processes of: (i) bonding backsides of RF power dies to a thermal extension panel containing a plurality of interconnected topside thermal extensions; (ii) after bonding, singulating the thermal extension panel to yield partially-fabricated PAMs each containing at least one RF power die bonded to a singulated topside thermal extension; (iii) after singulating the thermal extension panel, attaching the partially-fabricated PAMs to a substrate panel containing a plurality of interconnected module substrates such that each module substrate has at least one partially-fabricated PAM attached thereto; (iv) when attaching the RF power dies to the substrate panel, electrically coupling frontside I/O interfaces of the RF power dies to corresponding substrate interconnect features of the plurality of interconnected module substrates; and (v) after attaching the partially-fabricated PAMs to the substrate panel, further singulating the substrate panel to yield a plurality of PAMs each including at least one RF power die, a singulated module substrate to which the at least one RF power die is electrically coupled, and a singulated topside thermal extension opposite the module substrate. In certain embodiments, the method further includes overmolding the partially-fabricated PAMs to form a molded panel encapsulating the RF power dies and the thermal extensions after attaching the partially-fabricated PAMs to the substrate panel and prior to further singulating the substrate panel. The molded panel is then singulated concurrently with the substrate panel to separate the molded panel into a plurality of molded package bodies each containing at least one RF power die and having an upper surface through which a singulated topside thermal extension is exposed.

Embodiments of a PAM are further provided including a topside, a bottomside opposite the topside as taken along a centerline extending through the power amplifier module, and an RF power die located between the topside and the bottomside taken along the centerline. The RF power die has a frontside, a backside, and a frontside I/O interface on the frontside. The PAM further includes a module substrate to which the RF power die is mounted in an inverted orientation such that the frontside of the RF power die faces the module substrate. The module substrate includes substrate interconnect features electrically coupled to the I/O interface of the RF power die. A topside cooling interface is substantially coplanar with the topside of the PAM, while a primary heat extraction path extending from the backside of the RF power die to the topside cooling interface of the PAM in a direction opposite the module substrate. In certain cases, the PAM further includes a topside thermal extension having an upper surface at least partly defining the topside cooling interface of the PAM and having a lower surface in direct thermal contact with the backside of the RF power die. Additionally, in embodiments, the PAM may also include a molded module body surrounding the RF power die, peripherally surrounding the topside thermal extension, and contacting the module substrate. In this latter case, the topside thermal extension can extend from a location adjacent the RF power die in a direction opposite the module substrate to breach an upper surface of the molded module body.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements (e.g., package leads, transistors, and transistor-carrying die) were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A power amplifier module (PAM), comprising:
   a topside;
   a bottomside opposite the topside, as taken along a centerline extending through the power amplifier module;
   a radio frequency (RF) power die located between the topside and the bottomside taken along the centerline, the RF power die having a frontside, a backside, a frontside input/output (I/O) interface on the frontside, and a field effect transistor having a gate terminal and a drain terminal, wherein the frontside I/O interface includes a first bond pad electrically connected to the gate terminal, and a second bond pad electrically connected to the drain terminal;
   a module substrate having a die support surface, an outer principal surface opposite the die support surface, an interconnection interface at the die support surface, an assembly-level interface at the outer principal surface, and electrically-conductive interconnect features that electrically couple the interconnection interface with the assembly-level interface, wherein the RF power die is mounted to the module substrate in an inverted orientation such that the frontside of the RF power die faces the die support surface of the module substrate, the interconnection interface is electrically coupled to the frontside I/O interface of the RF power die, the interconnection interface includes a first substrate interconnect feature connected to the first bond pad of the RF power die, and a second substrate interconnect feature connected to the second bond pad of the RF power die, and the module substrate is devoid of thermal vias below the RF power die;
   a topside cooling interface substantially coplanar with the topside of the PAM;
   a topside thermal extension having an upper surface at least partly defining the topside cooling interface of the PAM and having a lower surface in thermal contact with the backside of the RF power die;
   a molded module body surrounding the RF power die and peripherally surrounding the topside thermal extension, wherein the molded module body is molded onto the die support surface of the module substrate and entirely covers the die support surface, and wherein the topside thermal extension extends from a location adjacent the RF power die in a direction opposite the module substrate to breach an upper surface of the molded module body; and
   a primary heat extraction path extending from the backside of the RF power die to the topside cooling interface of the PAM in a direction opposite the module substrate.

2. The PAM of claim 1, wherein:
   the field effect transistor further includes a source terminal;
   the frontside I/O interface of the RF power die further comprises a third bond pad electrically connected to the source terminal; and
   the interconnection interface further includes a third substrate interconnect feature connected to the third bond pad of the RF power die.

3. The PAM of claim 1, wherein:
   the field effect transistor has a drain manifold coupled to the second bond pad, a gate manifold coupled to the first bond pad, an interdigitated contact line array located between the drain manifold and the gate manifold, and a plurality of source contacts adjacent the interdigitated contact line array; and
   wherein the plurality of source contacts are each coupled to a third bond pad provided in the frontside I/O interface of the RF power die.

4. The PAM of claim 3, wherein the gate manifold of the field effect transistor is divided into a plurality of spaced manifold sections interspersed with the source contacts.

5. The PAM of claim 1, wherein the topside thermal extension comprises a prefabricated body having a thermal conductivity exceeding 100 Watts per meter-Kelvin, and
   wherein the topside thermal extension is bonded to the backside of the RF power die utilizing a thermally-conductive bonding material.

6. The PAM of claim 1, wherein the topside cooling interface has a length and a width equal to or greater than a length and a width of the RF power die, respectively.

7. The PAM of claim 1, wherein the topside thermal extension terminates at a location substantially coplanar with the upper surface of the molded module body.

8. The PAM of claim 1, wherein the topside cooling interface is shaped such that a length of the topside thermal extension increases with increasing distance from the RF power die.

9. The PAM of claim 1, wherein the topside cooling interface has a length greater than a length of the RF power die.

10. An electronic assembly comprising:
an assembly-level heatsink;
a power amplifier module (PAM) that includes
a topside,
a bottomside opposite the topside, as taken along a centerline extending through the power amplifier module,
a radio frequency (RF) power die located between the topside and the bottomside taken along the centerline, the RF power die having a frontside, a backside, a frontside input/output (I/O) interface on the frontside, and a field effect transistor having a gate terminal and a drain terminal, wherein the frontside I/O interface includes a first bond pad electrically connected to the gate terminal, and a second bond pad electrically connected to the drain terminal,
a module substrate having a die support surface, an outer principal surface opposite the die support surface, an interconnection interface at the die support surface, an assembly-level interface at the outer principal surface, and electrically-conductive interconnect features that electrically couple the interconnection interface with the assembly-level interface, wherein the RF power die is mounted to the module substrate in an inverted orientation such that the frontside of the RF power die faces the die support surface of the module substrate, the interconnection interface is electrically coupled to the frontside I/O interface of the RF power die, and the interconnection interface includes a first substrate interconnect feature connected to the first bond pad of the RF power die, and a second substrate interconnect feature connected to the second bond pad of the RF power die,
a topside cooling interface substantially coplanar with the topside of the PAM, and coupled to the assembly-level heatsink through a thermally-conductive bond layer,
a topside thermal extension having an upper surface at least partly defining the topside cooling interface of the PAM and having a lower surface in thermal contact with the backside of the RF power die,
a molded module body surrounding the RF power die and peripherally surrounding the topside thermal extension, wherein the molded module body is molded onto the die support surface of the module substrate and entirely covers the die support surface, and wherein the topside thermal extension extends from a location adjacent the RF power die in a direction opposite the module substrate to breach an upper surface of the molded module body, and
a primary heat extraction path extending from the backside of the RF power die to the topside cooling interface of the PAM in a direction opposite the module substrate; and
the thermally-conductive bond layer, which directly connects the assembly-level heatsink and the topside cooling interface of the PAM, wherein the thermally-conductive bond layer is formed from a compliant, thermally-conductive material to allow conformal contact between the assembly-level heatsink and the topside cooling interface.

11. The electronic assembly of claim 10, further comprising:
an assembly-level substrate with a frontside and contacts on the frontside, wherein the assembly-level interface at the outer principal surface of the PAM is coupled to the contacts on the frontside of the assembly-level substrate.

12. The electronic assembly of claim 10, wherein:
the assembly-level heatsink is a heatsink selected from a fin array and a metal chassis.

13. The electronic assembly of claim 10, wherein the topside cooling interface is shaped such that a length of the topside thermal extension increases with increasing distance from the RF power die.

* * * * *